United States Patent [19]
Kitani et al.

[11] Patent Number: 5,633,939
[45] Date of Patent: May 27, 1997

[54] COMPANDER CIRCUIT

[75] Inventors: Kazuhiro Kitani; Yuji Segawa; Kunihiko Gotoh, all of Kawasaki, Japan

[73] Assignee: Fujitsu Limited, Kawasaki, Japan

[21] Appl. No.: 319,721

[22] Filed: Oct. 7, 1994

[30] Foreign Application Priority Data

Dec. 20, 1993 [JP] Japan .................................. 5-320439
Aug. 25, 1994 [JP] Japan .................................. 6-201036

[51] Int. Cl.$^6$ .................................................. H03G 7/00
[52] U.S. Cl. ................................................ 381/106; 333/14
[58] Field of Search .................................... 381/106, 107, 381/108, 57; 375/345; 333/14

[56] References Cited

U.S. PATENT DOCUMENTS

| | | | |
|---|---|---|---|
| 4,691,377 | 9/1987 | Yoshihara et al. | 375/345 |
| 4,707,840 | 11/1987 | Nakayama | 375/345 |
| 5,134,722 | 7/1992 | Emslie et al. | 375/345 |

FOREIGN PATENT DOCUMENTS 4-355517  12/1992  Japan .

OTHER PUBLICATIONS

Lancaster, TTL Cookbook, pp. 243, 244, 1974.

Chamberlin, Musical Applications of Microprocessors, pp. 344, 343.

*Primary Examiner*—Forester W. Isen
*Attorney, Agent, or Firm*—Nikaido, Marmelstein, Murray & Oram LLP

[57] ABSTRACT

A compander circuit includes first and second volume controllers, a comparator, a counter and a control part. The comparator compares a compared voltage with a rectified and smoothed signal of an input signal of the compander circuit or an output signal of the first volume controller receiving the input signal, the compared voltage being an output signal of the second volume controller. The counter executes a count operation on an output signal of the comparator in synchronism with a clock signal and controls gains of the first and second volume controllers on the basis of a counter value of the counter. The control part controls a frequency of the clock signal applied to the counter by a predetermined control signal.

30 Claims, 36 Drawing Sheets

PRIOR ART   INPUT

PRIOR ART   COMPRESSOR

PRIOR ART   EXPANDER

FIG.7

| D3 | D2 | D1 | Dφ | FREQUENCY DIVIDING RATIO |
|---|---|---|---|---|
| 0 | 0 | 0 | 0 | — |
| 0 | 0 | 0 | 1 | 1/2 |
| 0 | 0 | 1 | 0 | 1/3 |
| 0 | 0 | 1 | 1 | 1/4 |
| 0 | 1 | 0 | 0 | 1/5 |
| 0 | 1 | 0 | 1 | 1/6 |
| 0 | 1 | 1 | 0 | 1/7 |
| 0 | 1 | 1 | 1 | 1/8 |
| 1 | 0 | 0 | 0 | 1/9 |
| 1 | 0 | 0 | 1 | 1/10 |
| 1 | 0 | 1 | 0 | 1/11 |
| 1 | 0 | 1 | 1 | 1/12 |
| 1 | 1 | 0 | 0 | 1/13 |
| 1 | 1 | 0 | 1 | 1/14 |
| 1 | 1 | 1 | 0 | 1/15 |
| 1 | 1 | 1 | 1 | 1/16 |

(D3=1, D2=0, D1=0, Dφ=1 : 1/10)

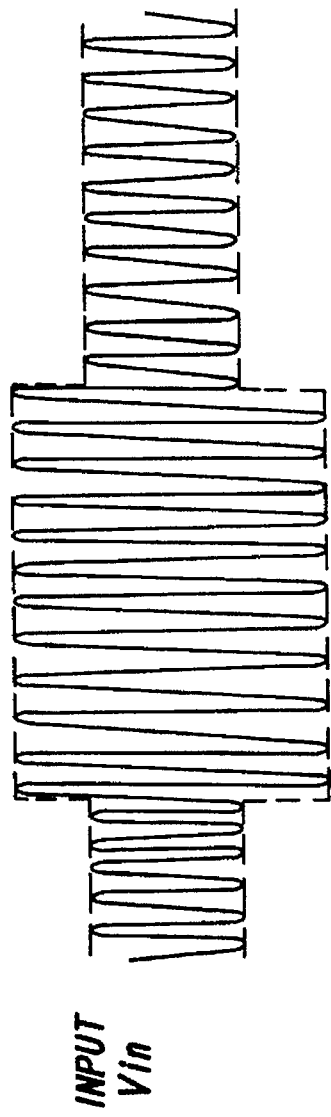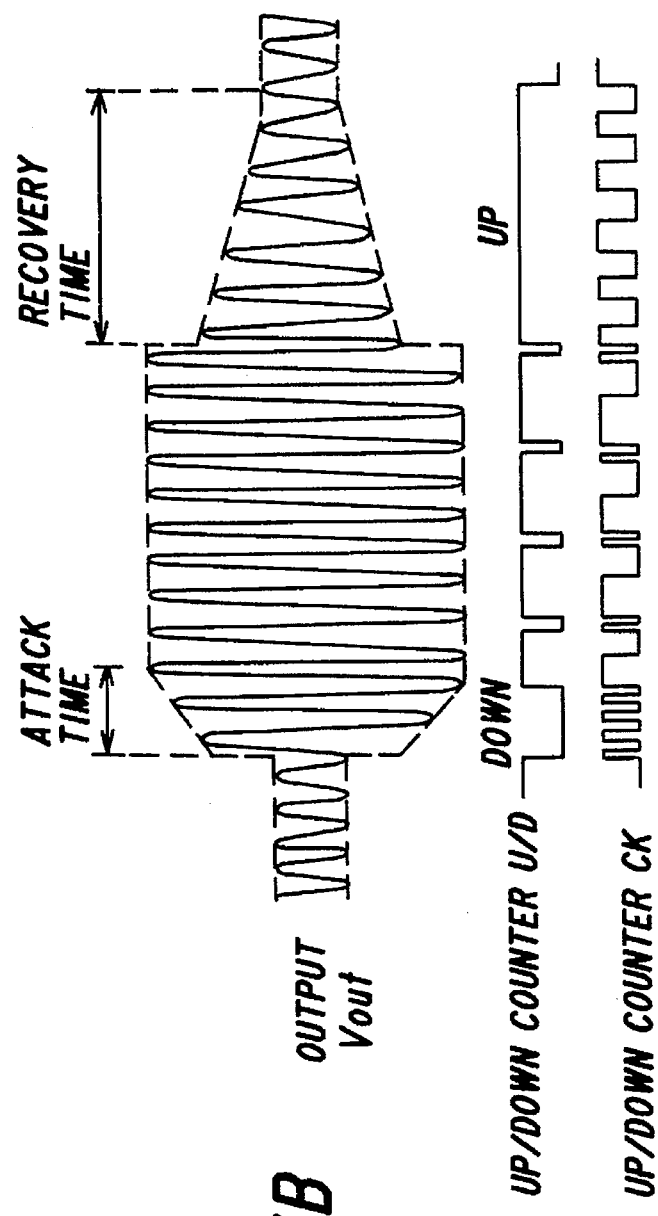
FIG.13A
FIG.13B

F I G. 1 7

| OUTPUT OF UP/DOWN COUNTER | | | | | | | INPUT OF PROGRAMMABLE COUNTER | | | | FREQUENCY DIVIDING RATIO |
|---|---|---|---|---|---|---|---|---|---|---|---|
| $D_6$ | $D_5$ | $D_4$ | $D_3$ | $D_2$ | $D_1$ | $D_0$ | $D_3$ | $D_2$ | $D_1$ | $D_0$ | |
| 0 | 0 | 0 | 0 | × | × | × | 1 | 1 | 1 | 1 | 1/16 |
| 0 | 0 | 0 | 1 | × | × | × | 1 | 1 | 1 | 0 | 1/15 |
| 0 | 0 | 1 | 0 | × | × | × | 1 | 1 | 0 | 1 | 1/14 |
| 0 | 0 | 1 | 1 | × | × | × | 1 | 1 | 0 | 0 | 1/13 |
| 0 | 1 | 0 | 0 | × | × | × | 1 | 0 | 1 | 1 | 1/12 |
| 0 | 1 | 0 | 1 | × | × | × | 1 | 0 | 1 | 0 | 1/11 |
| 0 | 1 | 1 | 0 | × | × | × | 1 | 0 | 0 | 1 | 1/10 |
| 0 | 1 | 1 | 1 | × | × | × | 1 | 0 | 0 | 0 | 1/9 |
| 1 | 0 | 0 | 0 | × | × | × | 0 | 1 | 1 | 1 | 1/8 |
| 1 | 0 | 0 | 1 | × | × | × | 0 | 1 | 1 | 0 | 1/7 |
| 1 | 0 | 1 | 0 | × | × | × | 0 | 1 | 0 | 1 | 1/6 |
| 1 | 0 | 1 | 1 | × | × | × | 0 | 1 | 0 | 0 | 1/5 |
| 1 | 1 | 0 | 0 | × | × | × | 0 | 0 | 1 | 1 | 1/4 |
| 1 | 1 | 0 | 1 | × | × | × | 0 | 0 | 1 | 0 | 1/3 |
| 1 | 1 | 1 | 0 | × | × | × | 0 | 0 | 0 | 1 | 1/2 |
| 1 | 1 | 1 | 1 | × | × | × | 0 | 0 | 0 | 1 | 1/2 |

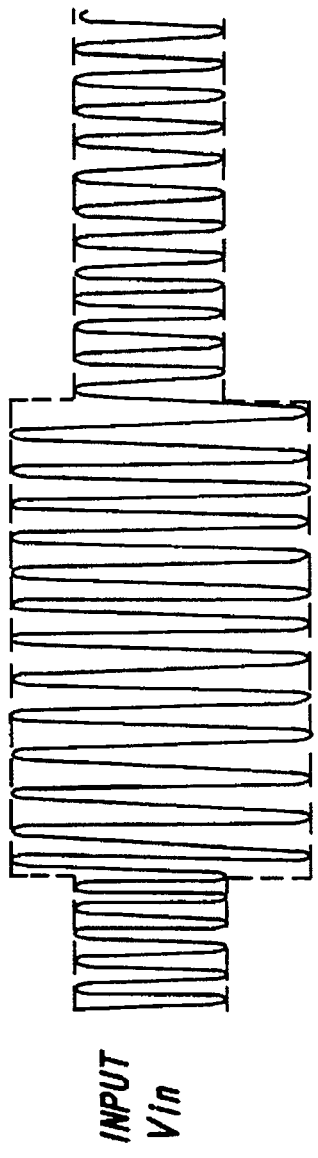
FIG.18A INPUT Vin
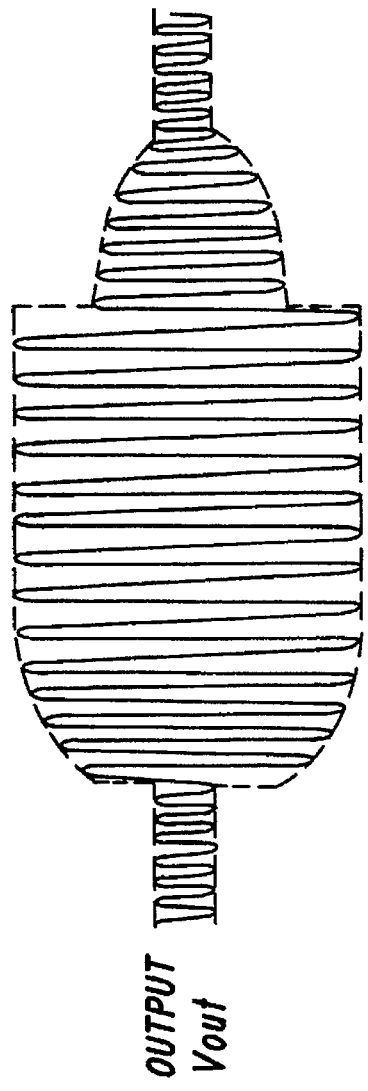
FIG.18B OUTPUT Vout
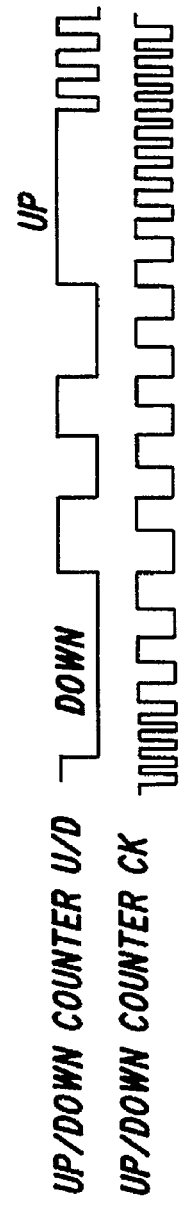
UP/DOWN COUNTER U/D
UP/DOWN COUNTER CK

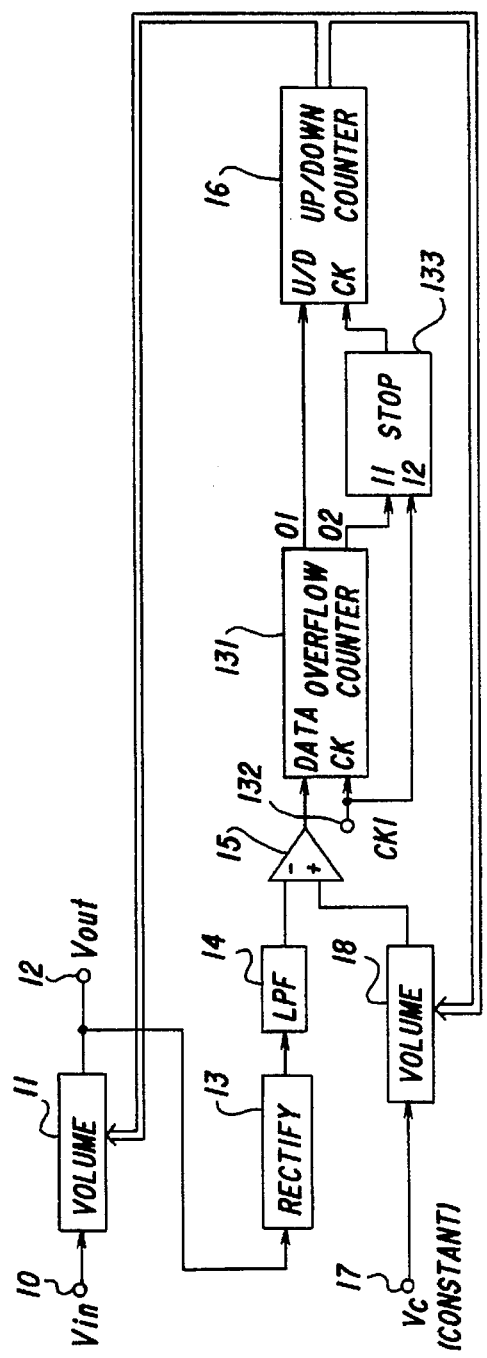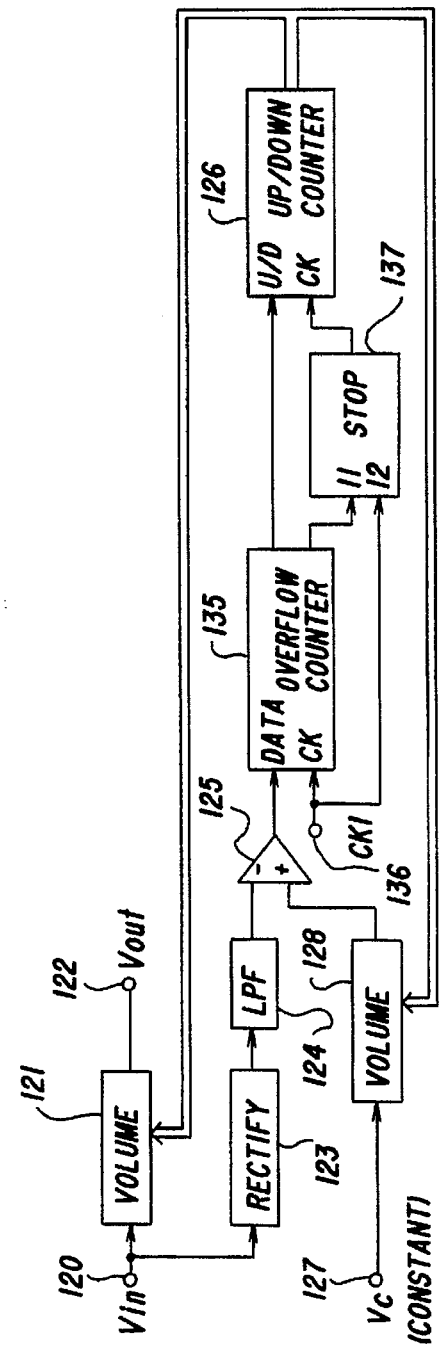

COMPANDER CIRCUIT

BACKGROUND OF THE INVENTION

1. Field of the Invention

The present invention generally relates to compander circuits, and more particularly to a compander circuit which functions as a compressor for compressing an input signal and/or an expander for expanding an input signal.

Recently, wireless automobile telephones, cordless telephones and digital telephones using digital line circuits have become widespread. Nowadays, it is required to reduce the production cost and the size of communications devices as described above. Normally, a compander circuit functioning as a compressor and/or an expander is used to prevent the degradation of speech communications quality and the signal-to-noise ratio (S/N ratio).

2. Description of the Prior Art

FIG. 1 is a block diagram of a conventional compander circuit, which is made up of an input terminal 10, an electronic volume controller 11, an output terminal 12, a rectifier circuit 13, a low-pass filter (LPF) 14, a comparator 15, an up/down counter 16, a control terminal 17 and an electronic volume controller 18. When the compander circuit is used as a compressor, the input terminal of the rectifier circuit 13 is connected to the output terminal of the electronic volume controller 11, as shown by the broken line. When the compander circuit is used as an expander, the input terminal of the rectifier circuit 13 is connected to the input terminal 10, as shown by the one-dot chained line. More particularly, when the compander operates as the compressor, an input signal Vin applied to the input terminal 10 is applied to the electronic volume controller 11, and an output signal Vout having a level adjusted by the electronic volume controller 11 is output to a signal processing circuit of the next stage via the output terminal 12 and to the rectifier circuit 13. When the compander operates as an expander, the input signal Vin is directly applied to the rectifier circuit 13.

The rectifier circuit 13 performs the full-wave rectifying operation on the input signal Vin or the output signal Vout. The rectified signal is smoothed by the low-pass filter 14, and is applied to the inverting input terminal of the comparator 15. The electronic volume controller 18 adjusts the level of a constant voltage Vc applied to the control terminal 17, and is applied to the non-inverting input terminal of the comparator 15. The comparator 15 compares the voltages applied to the two input terminals, and outputs the voltage equal to the difference between these voltages to an up/down count control terminal U/D of the up/down counter 16.

The up/down counter 16 counts down a clock applied to a clock terminal CK when the output signal of the comparator 15 is at a low level, and counts up the clock when the output signal of the comparator 15 is at a high level. The counter value is applied to the electronic volume controllers 11 and 18 as a gain control code. The gains of the electronic volume controllers 11 and 18 are controlled so that the output signal of the low-pass filter 14 has almost the same level as the output signal of the electronic volume controller 18. Hence, the output signal Vout output via the output terminal 12 has an expanded or compressed level. When the compander operates as the compressor, the gain of the electronic volume controller 11 becomes larger as the level of the input signal Vin becomes lower to hence increase the level of the output signal Vout. When the compander operates as the expander, the gain of the electronic volume controller 11 becomes smaller as the level of the input signal Vin becomes higher to hence decrease the level of the output signal Vout.

FIG. 2 is a diagram showing the operation of the compander which operates as the compressor and the operation thereof which operates as the expander. Normally, the compressor is provided in a transmitter system of a radio communications device such as an automobile telephone set. The compressor processes a voice signal from a microphone so that the voice signal has a higher level as the level of the voice signal from the microphone becomes lower. The expander is provided in a receiver system, and processes the voice signal to be applied to a speaker so that the voice signal applied thereto has a lower level as the voice signal applied to the expander becomes low. As shown in FIG. 2, if a noise of −60 dB is superimposed on a transmission system, the noise is suppressed to −120 dB at the receiver side, so that the noise can be substantially eliminated and the good communications quality can be ensured.

Meanwhile, the compander circuit has a transient response such that natural voice can be reproduced.

FIG. 3A shows an example of the input signal Vin, and FIG. 3B shows the waveform of the output signal Vout output by the compressor having the structure shown in FIG. 1. FIG. 3C shows the waveform of the output signal Vout output by the expander having the structure shown in FIG. 1. As shown in FIG. 3B, the output waveform of the compressor which receives an abrupt rise of the input signal rises abruptly, and gradually decreases to a constant level. The time necessary for the above operation to be completed is called "attack time". Further, as shown in FIG. 3B, the output waveform of the compressor which receives an abrupt fall of the input signal falls abruptly, and gradually increases to a constant level. The time necessary for the above operation to be completed is called "recovery time". Similarly, the expander has an attack time and a recovery time.

The lengths of the attach and recovery times influence the quality of the reproduced voice. For example, when the attack time is short, the reproduced voice has little noise but is not a natural voice. The attack and recovery times depend on the time constant (frequency characteristic) of the low-pass filter 14. That is, in order to adjust the attack and recovery times, it is necessary to finely adjust the time constant of the low-pass filter 14.

However, the conventional compander described above has the following disadvantages.

Generally, the low-pass filter 14 is formed of a resistor and a capacitor. Hence, in order to realize the fine adjustment of the time constant of the low-pass filter 14, it is necessary to use a plurality of resistors and capacitors. This increases the circuit size. Further, if the precision of the resistors and/or capacitors is poor, the desired attack and recovery times cannot be obtained. Furthermore, the time constant of the low-pass filter 14 relating to charging is equal to that relating to discharging, and it is impossible to set the attack and recovery time to be different from each other.

The transmitter system needs the compressor characteristic in order to prevent an excessive input level, but needs the expander characteristic in order to suppress ambient noise. That is, there is a case where the compressor characteristic is needed when the input signal level is high, the expander characteristic is needed when the input signal level is low. However, the structure shown in FIG. 1 does not selectively function as the compressor or expander. That is, when the connection indicated by the broken line shown in FIG. 1 is employed, the structure shown in FIG. 1 cannot operate as the expander.

Furthermore, the output signal of the low-pass filter 14 contains a ripple component having a frequency higher than the cut-off frequency of the low-pass filter 14, and thus varies. The output levels of the electronic volume controllers 11 and 18 vary stepwise. Hence, if the output level of the low-pass filter 14 is constant but corresponds to a level located between stepwise levels of the electronic volume controllers 11 and 18, the output levels of the electronic volume controllers 11 and 18 do not completely coincide with the output level of the low-pass filter 14. Hence, the output signals of the electronic volume controllers 11 and 18 rise and fall repeatedly. That is, the gains of the electronic volume controllers 11 and 18 vary. This causes noise superimposed in the output signal Vout of the compander output via the output terminal 12.

SUMMARY OF THE INVENTION

It is a general object of the present invention to provide a compander circuit in which the above disadvantages are eliminated.

A more specific object of the present invention is to provide a compander circuit capable of providing the variable attack and recovery times which can be controlled without changing of the time constant of the low-pass filter and providing both the compressor characteristic and the expander characteristic.

Another object of the present invention is to provide a compander circuit in which noise caused by variations in the gains of electronic volume controllers can be suppressed and the output signal having little noise can be provided.

The above objects of the present invention are achieved by a compander circuit comprising: first and second volume controllers; a comparator which compares a compared voltage with a rectified and smoothed signal of an input signal of the compander circuit or an output signal of the first volume controller receiving the input signal, the compared voltage being an output signal of the second volume controller; a counter which executes a count operation on an output signal of the comparator in synchronism with a first clock signal and controls gains of the first and second volume controllers on the basis of a counter value of the counter; and means for controlling a frequency of the first clock signal applied to the counter by a predetermined control signal.

The above objects of the present invention are also achieved by a compander circuit comprising: first and second volume controllers, the second volume controllers having a plurality of different input/output characteristics; a comparator which compares a compared voltage with a rectified and smoothed signal of an input signal of the compander circuit or an output signal of the first volume controller receiving the input signal, the compared voltage being an output signal of the second volume controller; a counter which executes a count operation on an output signal of the comparator in synchronism with a clock signal and controls gains of the first and second volume controllers on the basis of a counter value of the counter; and selecting means for selecting one of the plurality of different input/output characteristics according to a predetermined control signal, the compared voltage being based on the above one of the plurality of different input/output characteristics.

The above objects of the present invention are also achieved by a compander circuit comprising: first and second volume controllers; a comparator which compares a compared voltage with a rectified and smoothed signal of an input signal of the compander circuit or an output signal of the first volume controller receiving the input signal, the compared voltage being an output signal of the second volume controller; a first counter which executes a count operation on an output signal of the comparator in synchronism with a clock signal and controls gains of the first and second volume controllers on the basis of a counter value of the first counter; and means for supplying the clock signal to the first counter only when the input signal continues to be at a predetermined level for a predetermined term.

A further object of the present invention is to provide a communications device equipped with a compander circuit as defined above.

This object of the present invention is achieved by a communications device comprising: a transmit system; and a receive system, the transmit system and the receive system respectively having compander circuits, each of the transmit system and the receive system separately comprising: first and second volume controllers; a comparator which compares a compared voltage with a rectified and smoothed signal of an input signal of the compander circuit or an output signal of the first volume controller receiving the input signal, the compared voltage being an output signal of the second volume controller; a counter which executes a count operation on an output signal of the comparator in synchronism with a clock signal and controls gains of the first and second volume controllers on the basis of a counter value of the counter; and means for controlling a frequency of the clock signal applied to the counter by a predetermined control signal.

The above object of the present invention is also achieved by a communications device comprising: a transmit system; and a receive system, the transmit system having a compander circuit comprising: first and second volume controllers, the second volume controllers having a plurality of different input/output characteristics; a comparator which compares a compared voltage with a rectified and smoothed signal of an input signal of the compander circuit or an output signal of the first volume controller receiving the input signal, the compared voltage being an output signal of the second volume controller; a counter which executes a count operation on an output signal of the comparator in synchronism with a clock signal and controls gains of the first and second volume controllers on the basis of a counter value of the counter; and selecting means for selecting one of the plurality of different input/output characteristics according to a predetermined control signal, the compared voltage being based on the above one of the plurality of different of input/output characteristics, the compander circuit having both a compressor characteristic and an expander characteristic.

BRIEF DESCRIPTION OF THE DRAWINGS

Other objects, features and advantages of the present invention will become more apparent from the following detailed description when read in conjunction with the accompanying drawings, in which:

FIG. 7 is a diagram of an operation of the programmable counter shown in FIG. 6;

FIGS. 13A and 13B are waveform diagrams of an operation of the expander circuit shown in FIG. 12;

FIG. 17 is a diagram showing an operation of a decoder circuit shown in FIG. 16;

FIGS. 18A and 18B are waveform diagrams of the expander circuit shown in FIG. 16;

FIG. 29A is a block diagram of a compressor circuit according to a sixth embodiment of the present invention;

FIG. 29B is a block diagram of an expander circuit according to the sixth embodiment of the present invention;

DESCRIPTION OF THE PREFERRED EMBODIMENTS

Figure 4:
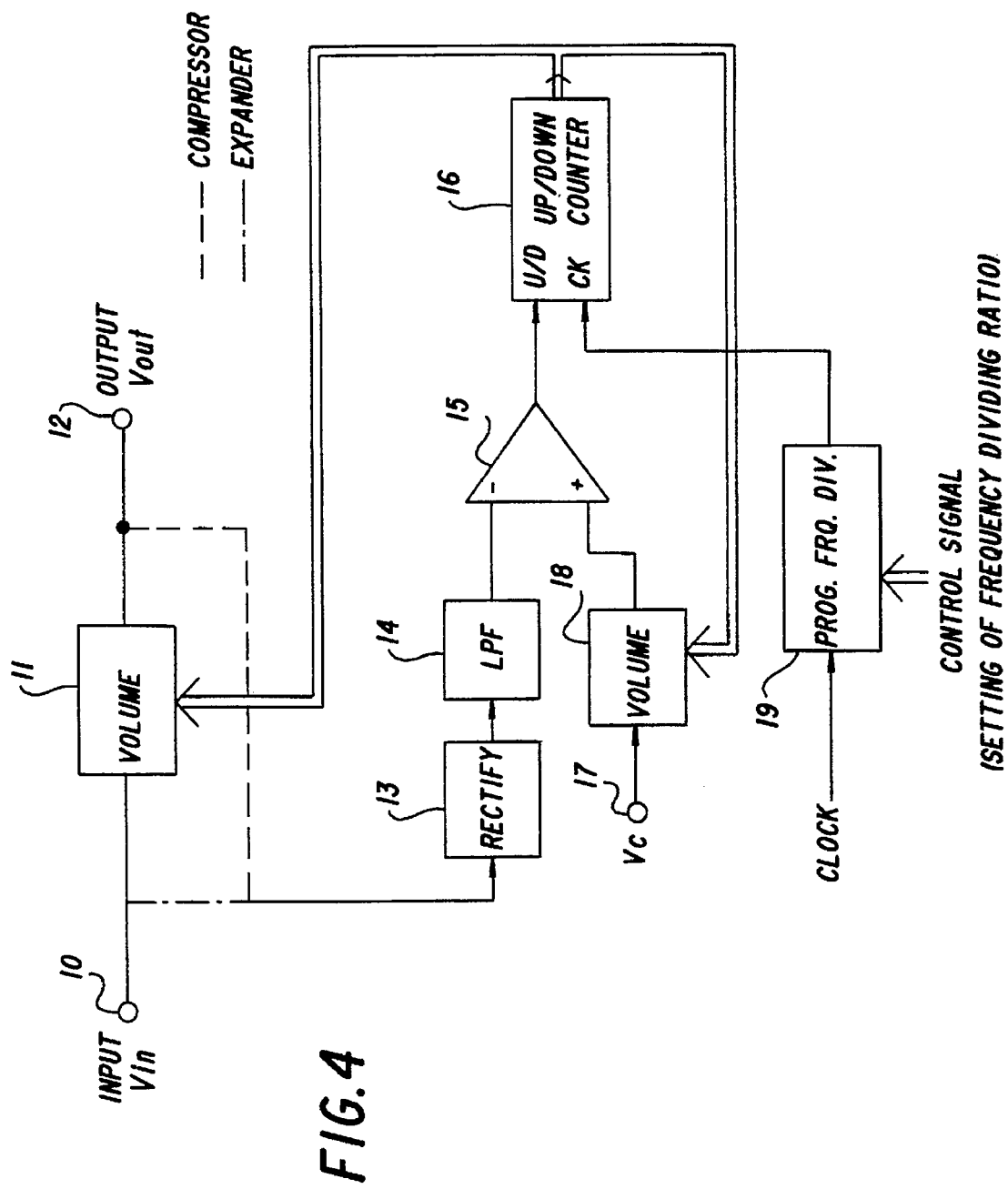
FIG. 4 is a block diagram of a first embodiment of the present invention.

FIG. 4 is a block diagram of a compander circuit according to a first embodiment of the present invention. In FIG. 4, parts that are the same as those shown in the previously described figures are given the same reference numbers, and a description thereof will be omitted here. When a connection indicated by the broken line shown in FIG. 4 is employed, the compander circuit functions as a compressor. When another connection indicated by the one-dot chained line is employed, the compander circuit functions as an expander.

The structure shown in FIG. 4 is formed by adding a programmable frequency divider circuit 19 thereto. The programmable frequency divider circuit 19 divides the frequency of the clock signal supplied from the outside of the compander circuit according to a frequency dividing ratio specified by a control signal supplied from the outside of the compander circuit. The frequency-divided clock signal output by the programmable frequency divider circuit 19 is applied to the clock terminal CK of the up/down counter 16. As will be described in detail later, by controlling the frequency of the clock signal to be applied to the up/down counter 16, it is possible to substantially control the attack time and the recovery time.

Figure 5:
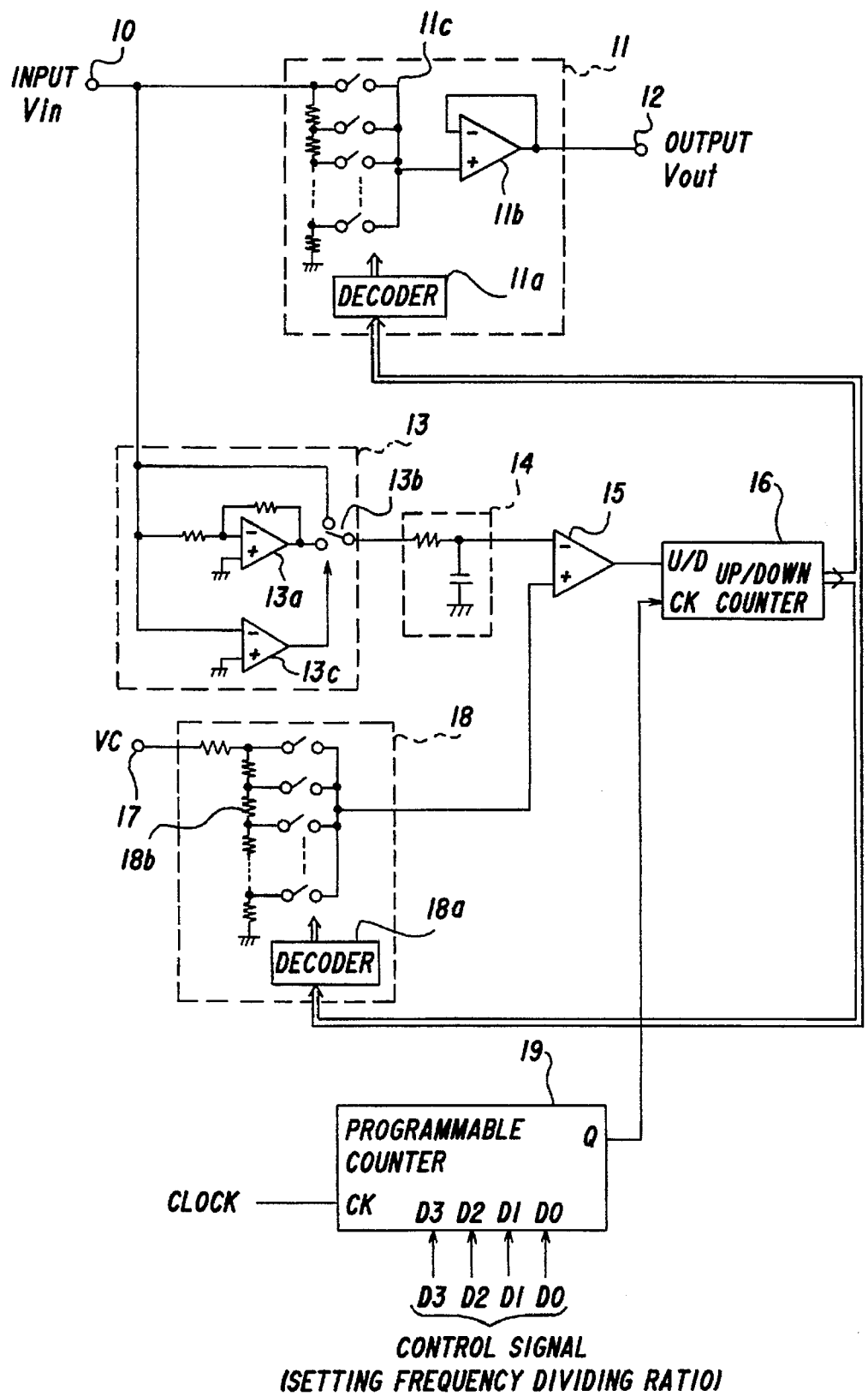
FIG. 5 is a block diagram of an expander circuit according to the first embodiment of the present invention.

FIG. 5 is a circuit diagram of the compander circuit shown in FIGS. 4 used as the expander. The first electronic volume controller 11 is made up of a decoder 11a, a differential amplifier 11b and a network 11c of resistors and switches. The decoder 11a decodes the counter value output by the up/down counter 16. One or a plurality of switches of the network 11c are operated in response to the output signal of the decoder 11a so that the differential amplifier 11b is set to a specified amplification degree. The second electronic volume controller 18 is made up of a decoder 18a and a network 18b of resistors and switches. The decoder 18a decodes the counter value output by the up/down counter 16. One or a plurality of switches of the network 18b are selected in response to the output signal of the decoder 18a, so that the constant voltage Vc is divided. The divided voltage output by the second electronic volume controller 18 is applied to the non-inverting input terminal of the comparator 15.

The rectifier circuit 13, which performs the full-wave rectifying operation, is made up of an inverted amplifier circuit 13a, a switch 13b and a comparator 13c. The amplifier 13a outputs, to the switch 13b, the inverted version of the input signal Vin applied to the input terminal 10. The comparator 13c compares the input signal Vin with the ground potential, and generates a control signal to be applied to the switch 13b. The switch 13b selects either the input signal Vin or the inverted version thereof in accordance with the control signal from the comparator 13c.

The low-pass filter 14 includes a resistor and a capacitor, as shown in FIG. 5. The up/down counter 16 performs the up-counting or down-counting operation on the basis of the level of the output signal of the comparator 15, that is, whether the output signal of the comparator 15 is high or low. In the following description, it will be assumed that the up/down counter 16 is a 7-bit up/down counter capable of outputting a 7-bit output signal. The programmable frequency divider circuit 19 is a 4-bit programmable counter in the expander being considered. The programmable counter 19 receives a 4-bit control signal (frequency dividing ratio setting signal) consisting of bits D3–D0 from the outside of the expander, and divides the frequency of the clock signal applied to a clock terminal CK of the counter 19 at a frequency dividing rate specified by the 4-bit control signal. The frequency-divided clock signal is applied to the clock terminal CK of the up/down counter 16 via an output terminal Q of the counter 19.

Figure 6:
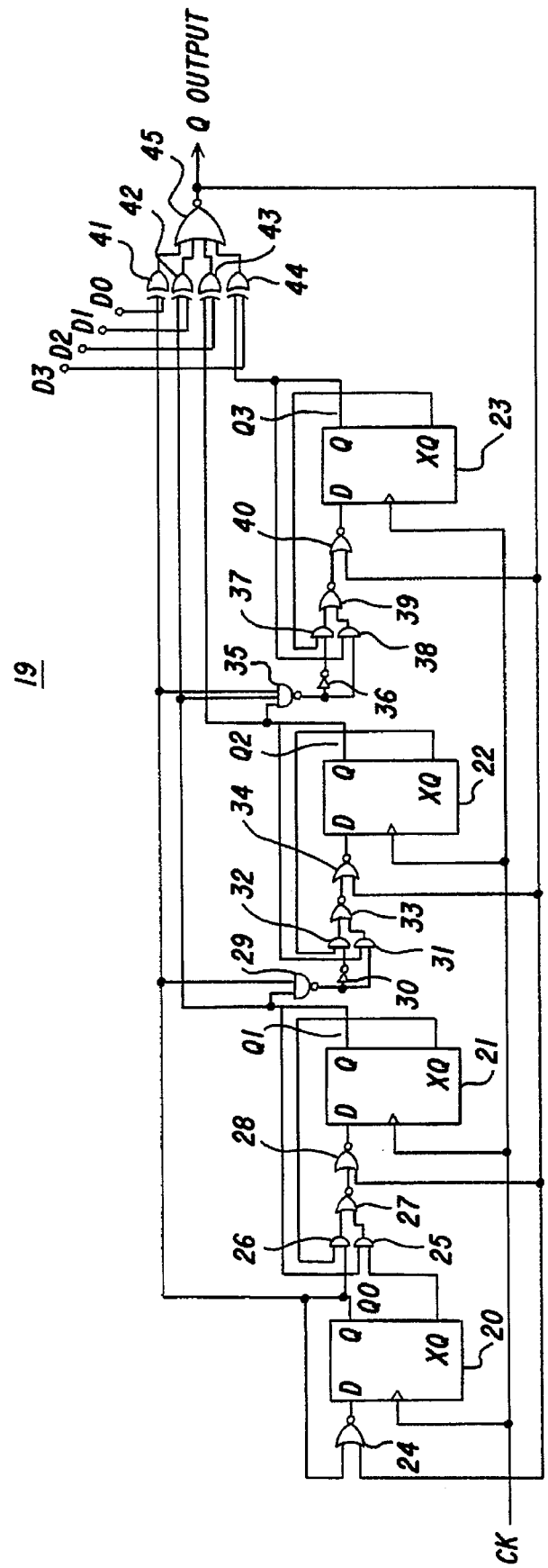
FIG. 6 is a block diagram of a programmable counter shown in FIG. 5.

FIG. 6 is a block diagram of the programmable counter 19 shown in FIG. 5. The programmable counter 19 includes D-type flip-flop circuits 20–23, NOR gates 24, 27, 28, 33, 34, 39, 40 and 45, AND gates 25, 26, 31, 32, 37 and 38, NAND gates 29 and 35, and exclusive-OR (EX-OR) gates 41–44. The flip-flop circuits 20–23 operate in synchronism with the clock signal applied to the programmable counter 19. The four control signal bits D3–D0 are applied to the EX-OR gates 44–41, respectively.

FIG. 7 is a diagram showing the values of the frequency dividing ratio which can be set by the control signal bits D3–D0. As shown in FIG. 7, the frequency dividing ratio can be set within the range of ½ to 1/16.

Figure 8:
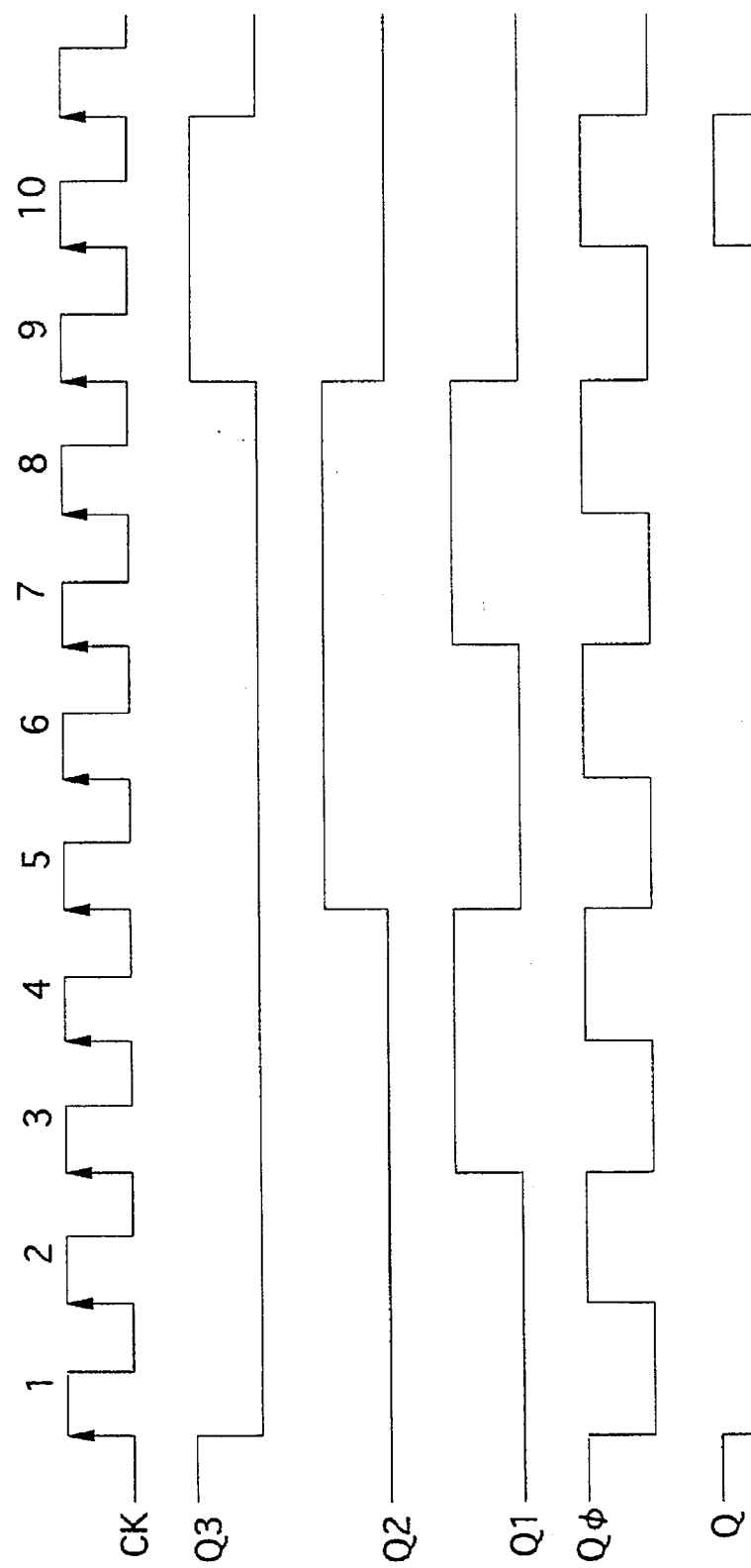
FIG. 8 is a timing chart of the operation of the programmable counter shown in FIG. 6.

FIG. 8 is a timing chart of the operation of the programmable counter 19 which is set to a frequency dividing ratio of 1/10 (D3=1, D2=0, D1=0, D0=1). In FIG. 8, the symbols Q0–Q3 denote the output signals of the flip-flop circuits 20–23 shown in FIG. 6, and the symbol Q denotes the output signal of the programmable counter 19 obtained at the output terminal Q thereof. As shown in FIG. 8, the clock signal having the frequency equal to 1/10 of the clock signal externally applied to the programmable counter 19 is output via the output terminal Q.

Figure 9A:
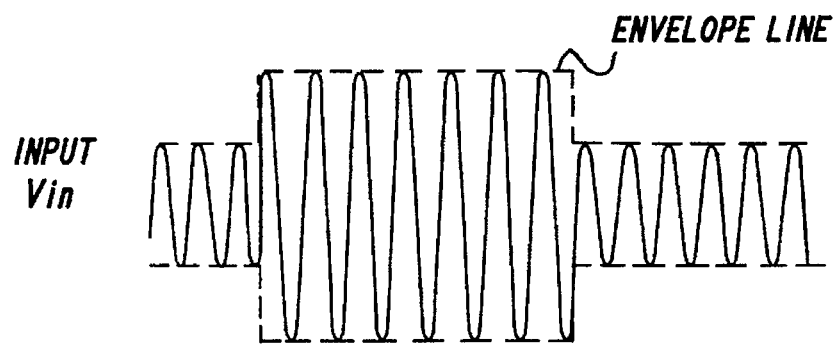
FIGS. 9A, 9B and 9C are waveform diagrams of the operation of the expander circuit shown in FIG. 5.
Figure 9B:
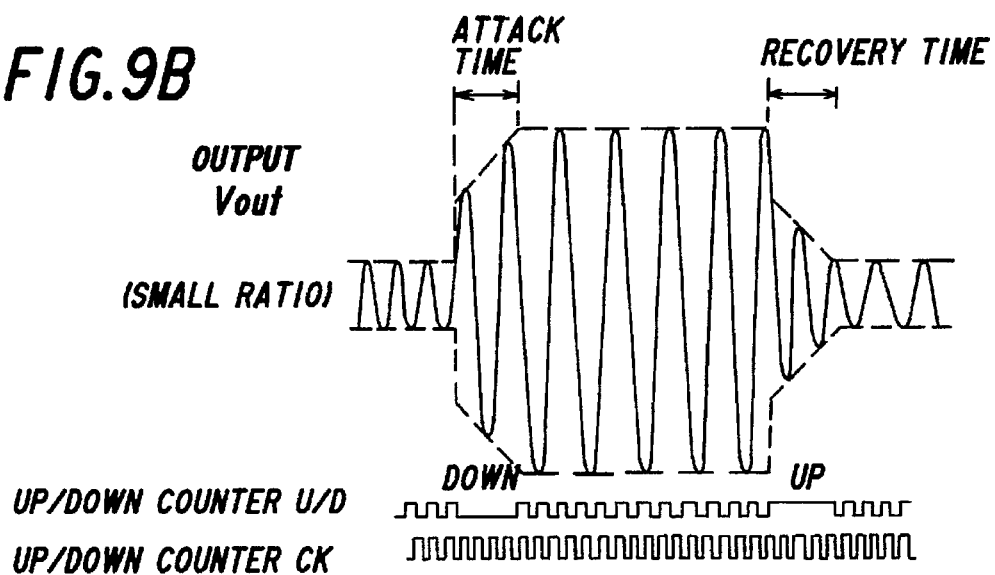
Figure 9C:
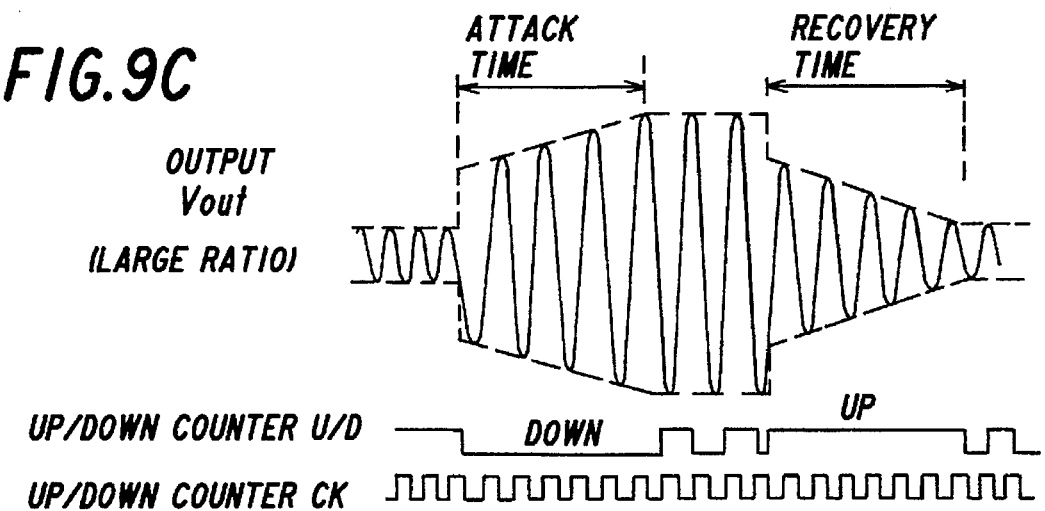

FIGS. 9A, 9B and 9C are waveform diagrams of the expander shown in FIG. 5. More particularly, FIG. 9A shows the input signal Vin, which is a sine wave signal varying in a stepwise formation. FIG. 9B shows the output signal Vout obtained when the frequency dividing ratio is set to a relatively large value. FIG. 9C shows the output signal Vout obtained when the frequency dividing ratio is set to a relatively small value.

When the peak level of the input signal Vin is constant, the output signal of the comparator 15 shown in FIG. 5 alternately switches to the high level and the low level. More particularly, when the output signal of the low-pass filter 14 is greater than the output signal of the electronic volume controller 18, the output signal of the comparator 15 is at the low level, which indicates the down-counting. Hence, the counter value of the up/down counter 16 is decreased. The decoder 18a decodes the above counter value, and increases the gain of the electronic volume controller 18. Hence, the output level of the electronic volume controller 18 is increased and becomes higher than the level of the output signal of the low-pass filter 14. Hence, the output signal of the comparator 15 is switched to the high level, which indicates the up-counting. The above up-counting and down-counting operations are alternately carried out, so that the output signal of the comparator 15 is alternately switched to the low level and the high level.

As shown in FIG. 9A, if the level of the input signal Vin becomes high abruptly, the output signal of the low-pass filter 14 is retained at levels higher than the output signal level of the electronic volume controller 18 during a term, and the output signal of the comparator 15 continues to be low. During the above period, the up/down counter 16 performs the down-count operation on the frequency-divided clock. As will be seen from FIGS. 9B and 9C, the value of the frequency-divided clock signal applied to the up/down counter 16 varies the time necessary for the output signal level of the electronic volume controller 18 to become higher than the output signal level of the low-pass filter 14, that is, varies the attack time. As the frequency of the clock signal applied to the up/down counter 16 becomes higher, the attack time becomes shorter. In the above-mentioned manner, it is possible to vary the attack time by changing the frequency of the clock signal applied to the up/down counter 16 rather than changing the time constant of the low-pass filter 14.

Similarly, the recovery time depends on the clock frequency of the up/down counter 16. That is, if the input signal Vin becomes low abruptly, as shown in FIG. 9C, the output signal of the low-pass filter 14 is retained at levels lower than the output signal level of the electronic volume controller 18 during a term, and the output signal of the comparator 15 continues to be high. During the above term, the up/down counter 16 performs the up-count operation on the frequency-divided clock. As will be seen from FIGS. 9B and 9C, the value of the frequency-divided clock signal applied to the up/down counter 16 varies the time necessary for the output signal level of the electronic volume controller 18 to become lower than the output signal level of the low-pass filter 14, that is, varies the recovery time. As the frequency of the clock signal applied to the up/down counter 16 becomes higher, the recovery time becomes shorter. In the above-mentioned manner, it is possible to vary the recovery time by changing the frequency of the clock signal applied to the up/down counter 16 rather than changing the time constant of the low-pass filter 14.

Figure 10:
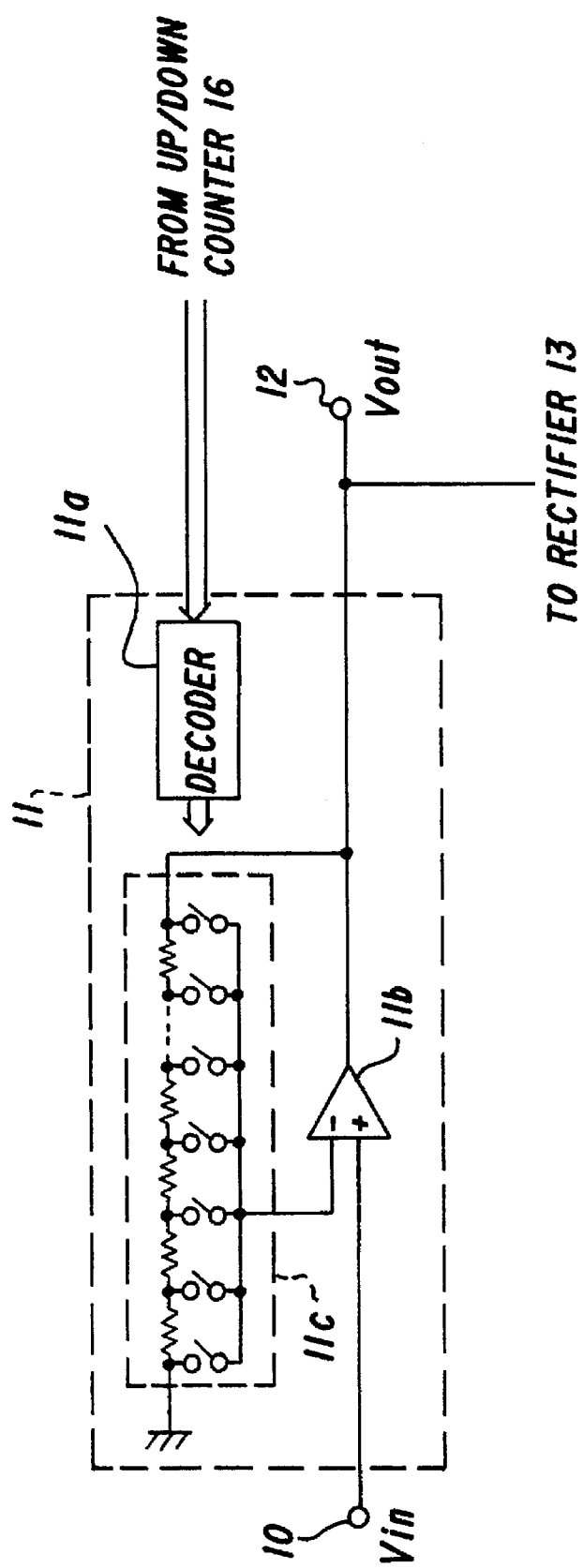
FIG. 10 is a block diagram of an electronic volume controller used when the structure shown in FIG. 4 is used as a compressor.

FIG. 10 is a circuit diagram of the first electronic volume controller 11 used when the connection indicated by the one-dot chained line shown in FIG. 4 is employed and the compander functions as the compressor. The rectifier circuit 13 used in the compressor circuit receives the output signal Vout of the electronic volume controller 11. As in the case of the electronic volume controller 11 used in the expander circuit, the electronic volume controller 11 shown in FIG. 10 includes the decoder 11a, the differential amplifier 11b and the network 11c which is used to change the amplification degree of the electronic volume controller 11. However, these elements are connected in a way different from those shown in FIG. 5. The structure shown in FIG. 10 functions so that the counter value of the up/down counter 16 decreases and the gain of the electronic volume controller 11 is increased when the level of the input signal Vin becomes low. The other elements of the compressor are the same as those shown in FIG. 5.

Figure 11:
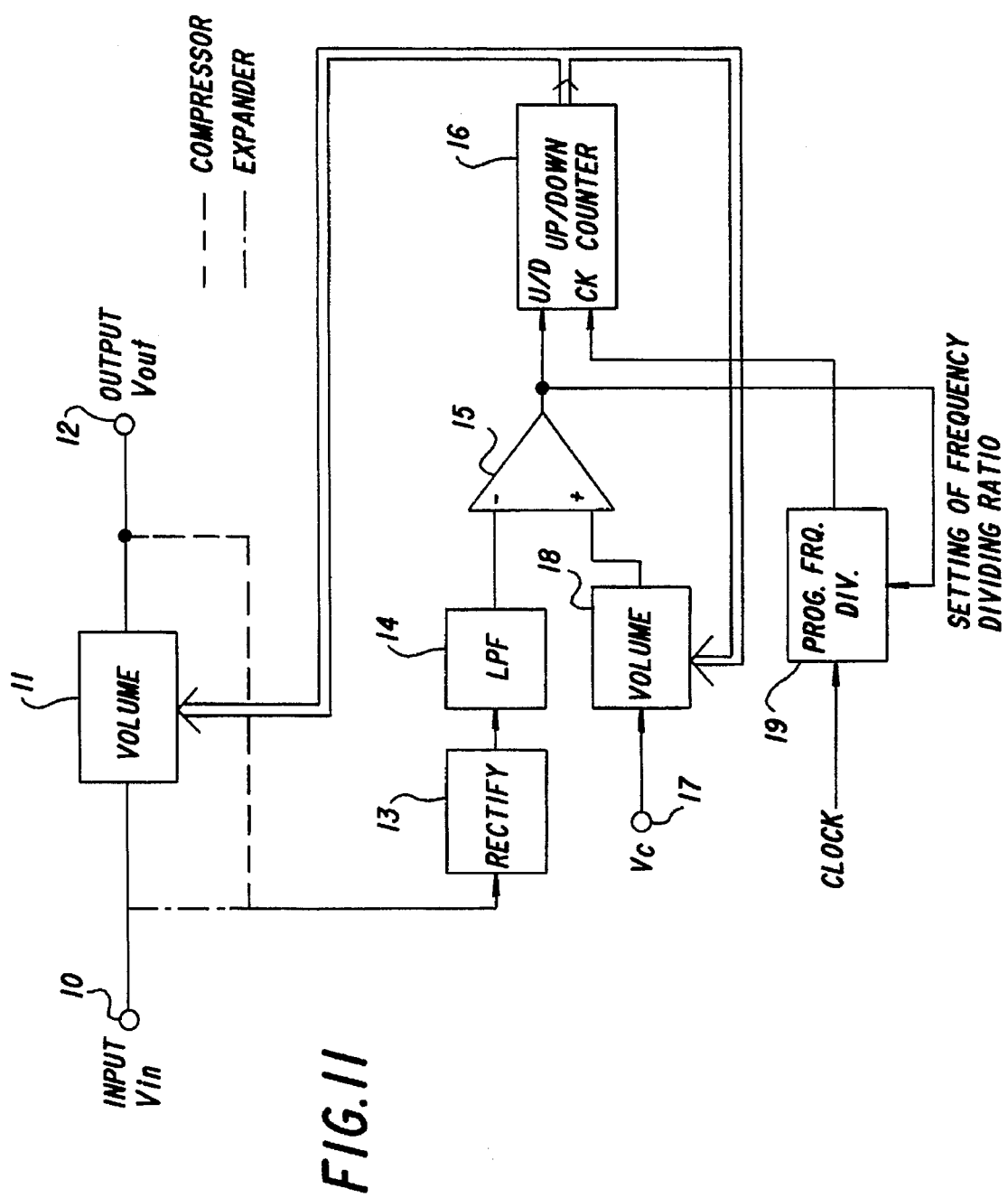
FIG. 11 is a block diagram of a second embodiment of the present invention.

FIG. 11 is a block diagram of a compander circuit according to a second embodiment of the present invention. In FIG. 11, parts that are the same as those shown in the previously described figures are given the same reference numbers, and a description thereof will be omitted here. The second embodiment of the present invention is designed to vary the attack time and the recovery time by controlling the frequency of the clock signal applied to the up/down counter 16 as in the case of the first embodiment thereof, but is different therefrom in the method of setting the frequency dividing ratio. According to the second embodiment of the present invention, the frequency dividing ratio setting signal is the output signal of the comparator 15.

Figure 12:
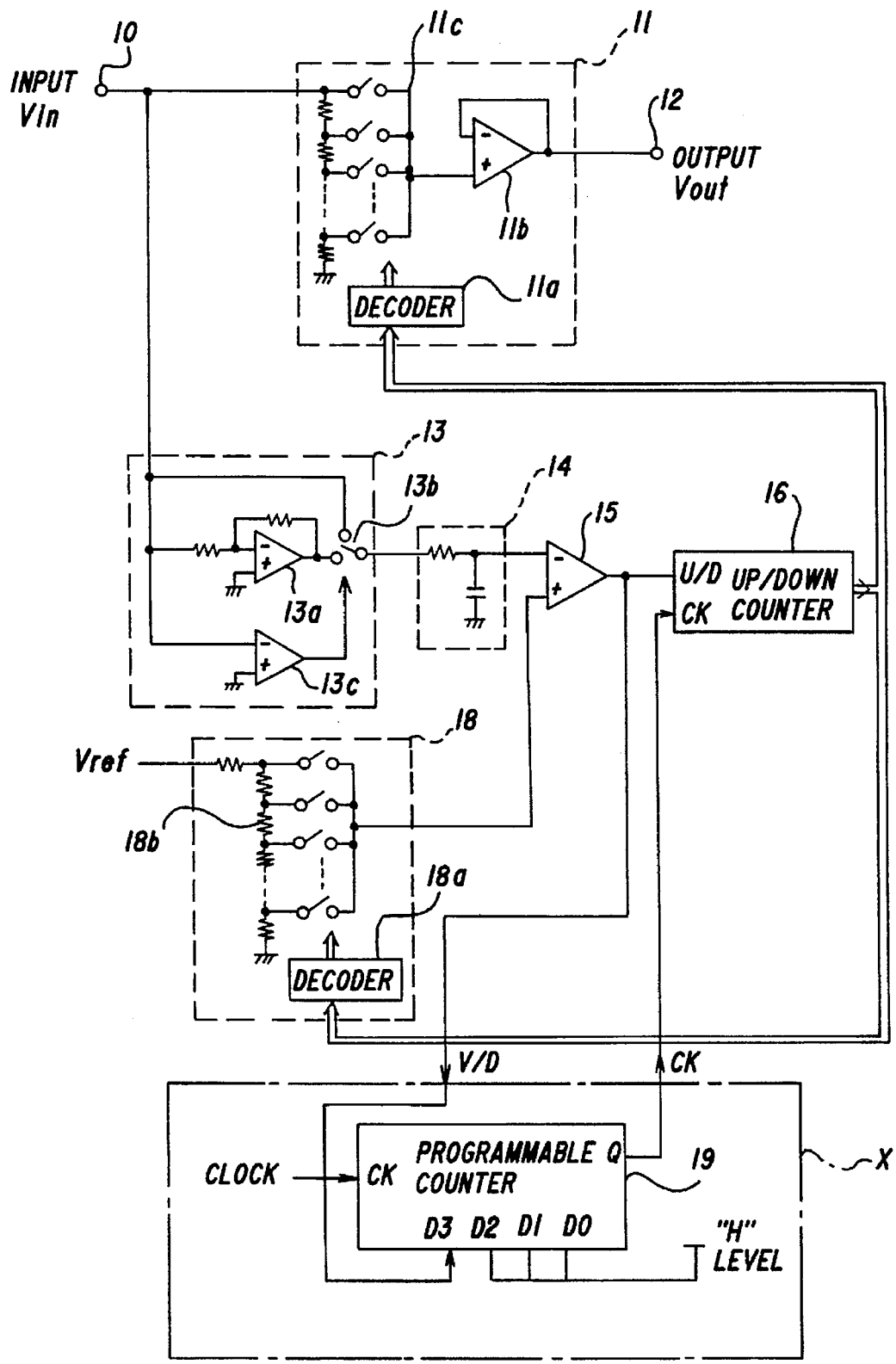
FIG. 12 is a block diagram of an expander circuit according to the second embodiment of the present invention.

FIG. 12 is a clock diagram of the compander circuit shown in FIG. 11 used as the expander. In FIG. 12, parts that are the same as those shown in FIG. 5 are given the same reference numbers and a description thereof will be omitted here. The output signal of the comparator 15 is applied to the data input terminal D3 of the 4-bit programmable counter 19, and the other data input terminals D2–D0 are fixed to the high level (which corresponds to the binary value "1"). It will be seen from FIG. 7 that the frequency dividing ratio of the programmable counter 19 can be set to either ⅛ or ¹⁄₁₆.

FIGS. 13A and 13B are waveform diagrams of the operation of the expander circuit shown in FIG. 12. More particularly, FIG. 13A shows the input signal Vin, which is a sine wave signal varying in the stepwise formation, and FIG. 13B shows the output signal Vout. When the input signal Vin becomes large, the output signal of the comparator 15 continues to be low ("0") during a term, and the frequency dividing ratio is set to a lower value (⅛ in the case shown in FIG. 12). When the input signal Vin becomes small, the output signal of the comparator 15 continues to be high ("1") during a term, and the frequency dividing ratio is set to a larger value (¹⁄₁₆ in the case shown in FIG. 12). That is, the operation of the up/down counter 16 carried out when the peak level of the input signal Vin decreases is slower than that carried out when the peak level of the input signal Vin increases. In this manner, it is possible to set the attack time and the recovery time to the different values according to the second embodiment of the present invention.

The possible values of the frequency dividing ratio of the programmable counter 19 are not limited to ⅛ and ¹⁄₁₆, but can be arbitrarily selected. When the compressor circuit is implemented, the electronic volume controller 11 shown in FIG. 12 is replaced by the electronic volume controller 11 shown in FIG. 10.

Figure 14:
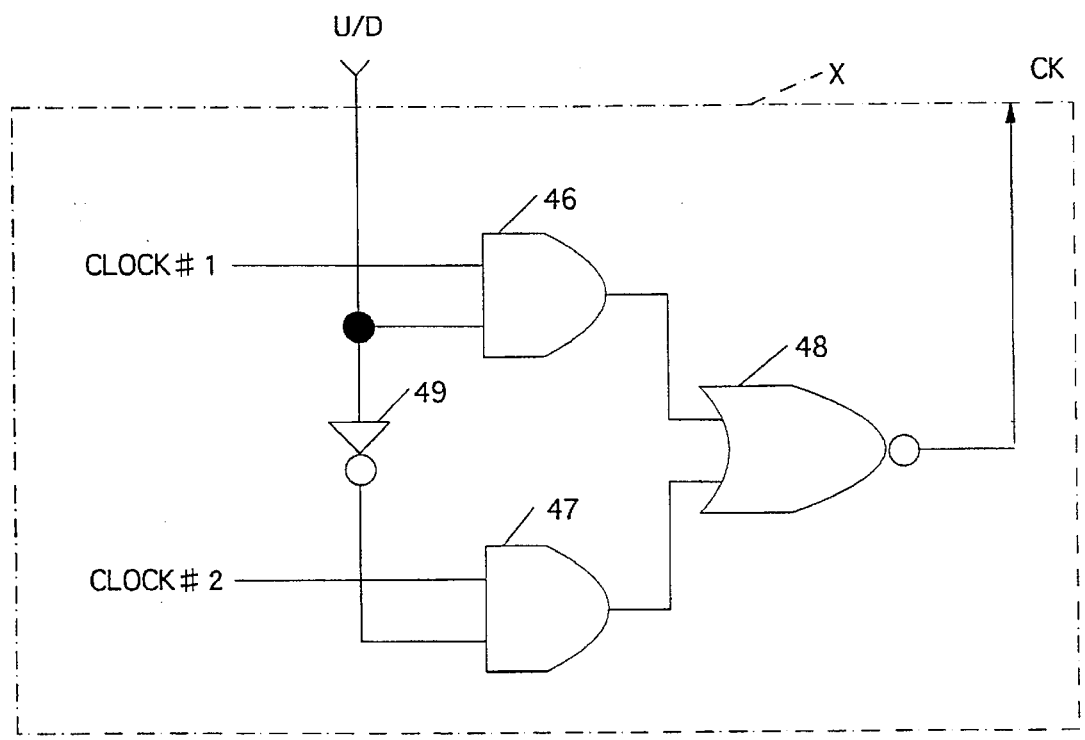
FIG. 14 is a block diagram of an alternative structure of a part shown in FIG. 12.

FIG. 14 shows another structure of the part X shown in FIG. 12. The structure shown in FIG. 14, which functions as a selector, selects either a clock signal #1 or a clock signal #2 according to the output signal of the comparator 15 shown in FIG. 12. The clock signal #2 has a frequency different from that of the clock signal #1. The selected clock signal is applied to the clock terminal CK of the up/down counter 16. The above selector is made up of AND gates 46 and 47, a NOR gate 48 and an inverter 49.

Figure 15:
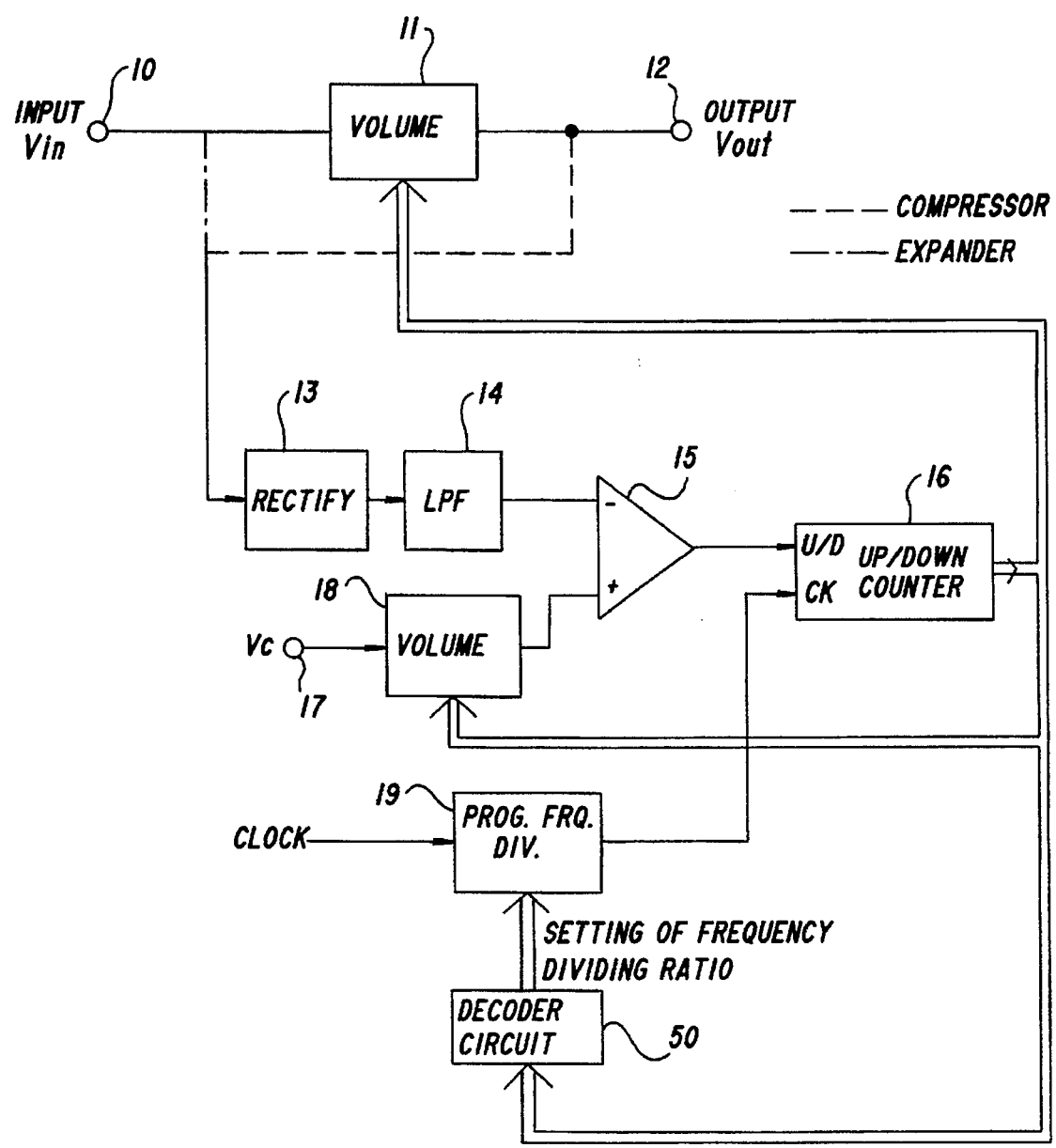
FIG. 15 is a block diagram of a third embodiment of the present invention.

FIG. 15 is a block diagram of a compander circuit according to a third embodiment of the present invention. In FIG. 15, parts that are the same as those shown in the previously described figures are given the same reference numbers and a description thereof will be omitted here. The third embodiment of the present invention is designed to vary the attack time and the recovery time by controlling the frequency of the clock signal applied to the up/down counter 16, as in the case of the first and second embodiments thereof. However, the third embodiment of the present invention selects the frequency dividing ratio in a way different from the ways of the first and second embodiments thereof. More particularly, according to the third embodiment of the present invention, the frequency dividing ratio setting signal applied to the programmable counter 19 is generated by decoding the output signal of the up/down counter 16 by means of a decoder circuit 50.

Figure 16:
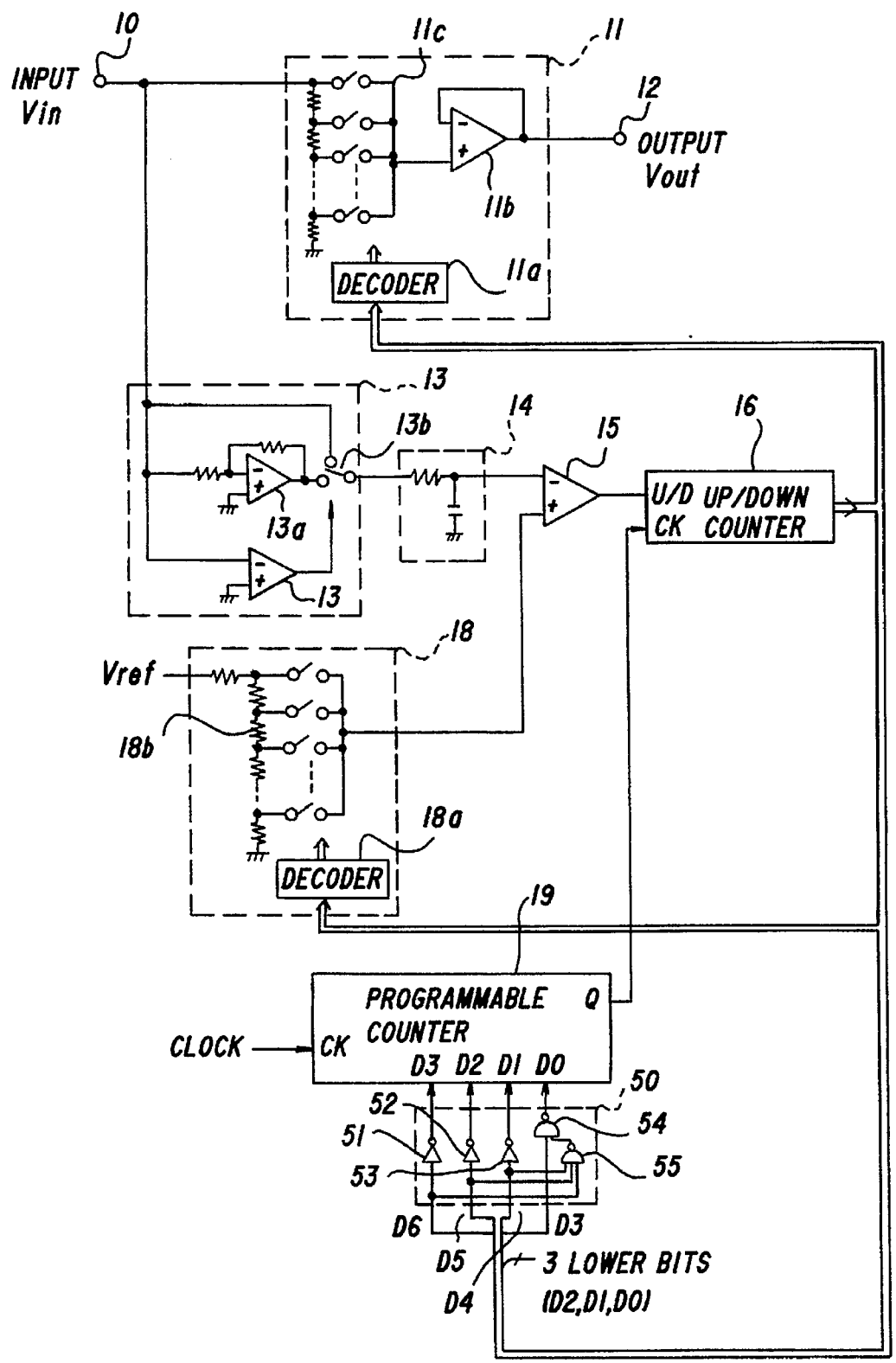
FIG. 16 is a block diagram of an expander circuit according to the third embodiment of the present invention.

FIG. 16 is a circuit diagram of the compander circuit shown in FIG. 15 used as the expander. In FIG. 16, parts that are the same as those shown in FIG. 15 are given the same reference numbers and a description thereof will be omitted here. The signals applied to the data input terminals D3–D0 of the 4-bit programmable counter 19 are generated by decoding the counter value of the up/down counter 16 by means of the decoder circuit 50. The decoder circuit 50 is made up of inverters 52–54, and NAND gates 54 and 55. The decoder circuit 50 decodes four upper bits D6–D3 among the seven output bits D6–D0 of the up-down counter 16, and does not use the three low bits D2–D0.

FIG. 17 is a diagram of the operation of the decoder circuit 50. As shown in FIG. 17, the decoder circuit 50 receives the output value of the up/down counter 16, and selects the frequency dividing ratio of the programmable counter 19 within the range of ½ to ¹⁄₁₆.

FIGS. 19A and 19B are waveform diagrams of the operation of the expander circuit shown in FIG. 16. More particularly, FIG. 19A is the sine-wave input signal Vin, which varies in the stepwise formation. FIG. 19B shows the output signal Vout of the expander circuit. When the peak level of the input signal Vin becomes higher, the output signal of the comparator 15 continues to be low during a term, and the counter value of the up/down counter 16 decreases for a while. In this case, as will be seen from FIG. 17, the output signals D6–D3 of the decoder circuit 50 change the frequency dividing ratio so that it has a larger value. Hence, as shown in FIG. 18B, the frequency of the clock signal applied to the up/down counter 16 gradually becomes low, and hence the output signal Vout gradually rises. When the peak level of the input signal Vin becomes low, the output signal of the comparator 15 continues to be high for a term, and the counter value of the up/down counter 16 increases. In this case, as will be seen from FIG. 17, the output signals D6–D3 of the decoder circuit 50 change the frequency dividing ratio so that it has a smaller value. Hence, as shown in FIG. 18B, the frequency of the clock signal applied to the up/down counter 16 gradually becomes high, and hence the output signal Vout falls so that the falling speed becomes higher. It is to be noted that the envelope of the rising part of the waveform of the output signal Vout is not straight but curved and the envelope of the falling part thereof is not straight but curved.

When the compander circuit shown in FIG. 16 is used as the compressor, the electronic volume controller shown in FIG. 10 is substituted for the electronic volume controller 11 shown in FIG. 16.

As has been described, according to the first to third embodiments of the present invention, it is possible to finely control the transient-response waveform of the output signal Vout with respect to a transient response of the input signal Vin and to hence reproduce speech naturally. Hence, the first to third embodiments can be applied to a communications system which will be described below.

Figure 19:
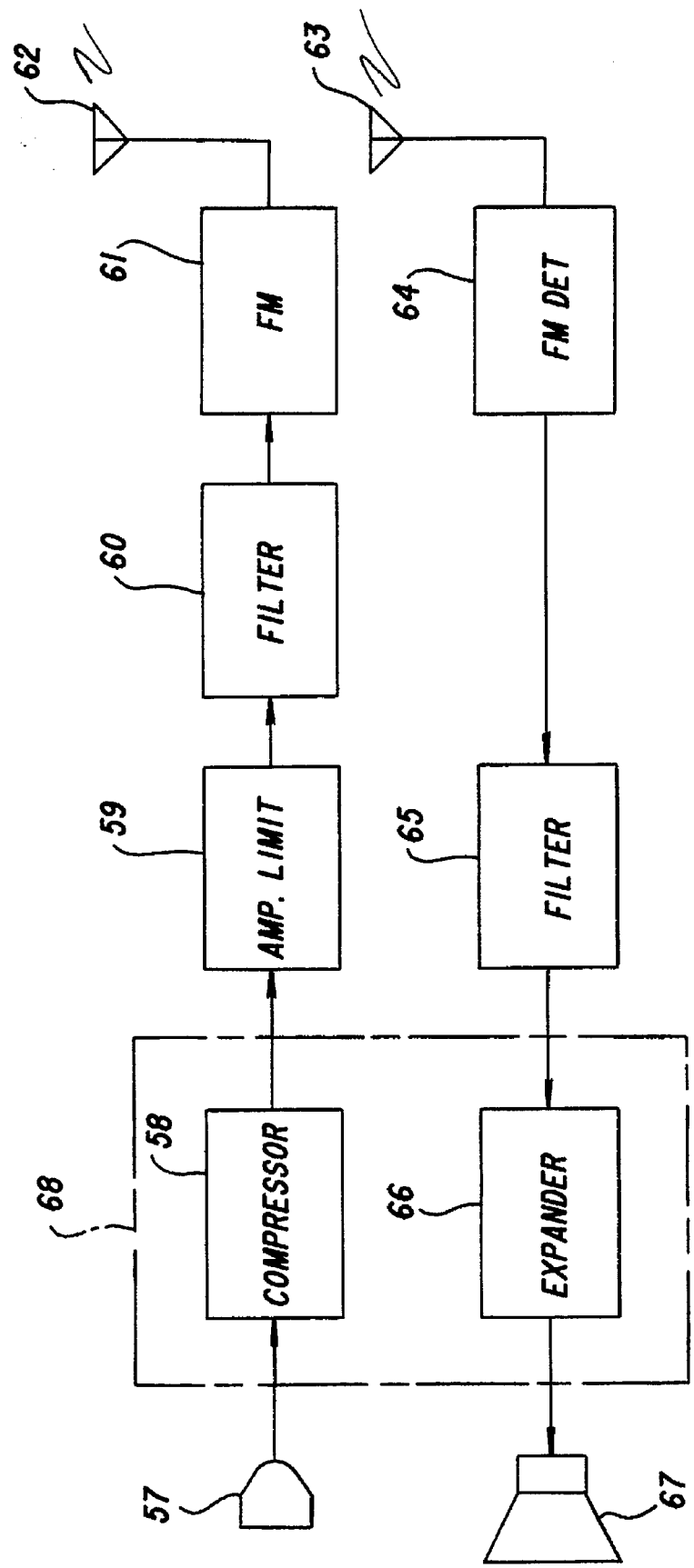
FIG. 19 is a block diagram of a communications device to which the first, second and third embodiments of the present invention can be applied.

FIG. 19 is a block diagram of a communications device to which one of the first to third embodiments of the present invention is applied. The communications device shown in FIG. 19 is a radio telephone set. The radio telephone set has a transmit system and a receive system. The transmit system includes a microphone (MIC) 57, a compressor circuit 58, an amplitude limiter 59, a filter circuit 60, an FM (Frequency Modulation) circuit 61 an antenna 62. The receive system includes an antenna 63, an FM detector 64, a filter circuit 65, an expander circuit 66 and a receiver (speaker) 67. Instead of the antennas 62 and 63, a single antenna can be used together with an antenna sharing device. The compressor circuit 58 and the expander circuit 66 form a compander circuit 68. The compressor circuit 58 and the expander circuit 66 are formed by the first through third embodiments of the present invention or combinations thereof.

In operation, a voice signal from the microphone 57 is compressed by the compressor circuit 58, and is limited to a predetermined amplitude range by means of the amplitude limiter 59. Unnecessary frequency components contained in the amplitude-limited voice signal are eliminated by the filter circuit 60. Then, the output signal of the filter circuit 60 is frequency-modulated by the frequency modulation circuit 61. Finally, the frequency-modulated signal is output via the antenna 62 as a radio wave. A radio wave received via the antenna 63 is demodulated by the FM detector 64, and unnecessary frequency components contained in the demodulated voice signal are eliminated by the filter circuit 65. The expander 66 expands the voice signal from the filter circuit 65, and the expanded voice signal is output to the speaker 67.

In the above operation, the compressor circuit 58 and the expander circuit 66 contribute to eliminating noise components and reproducing voice naturally by controlling the attack time and/or the recovery time according to the first and/or third embodiments of the present invention.

Figure 20A:
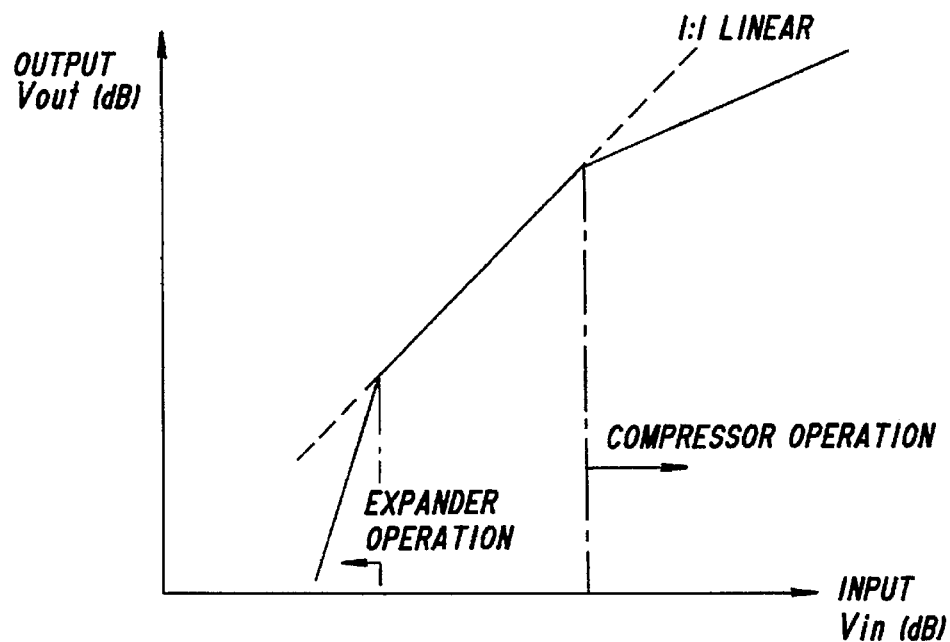
FIG. 20A is a graph of a desired input/output characteristic of a compander circuit.
Figure 20B:
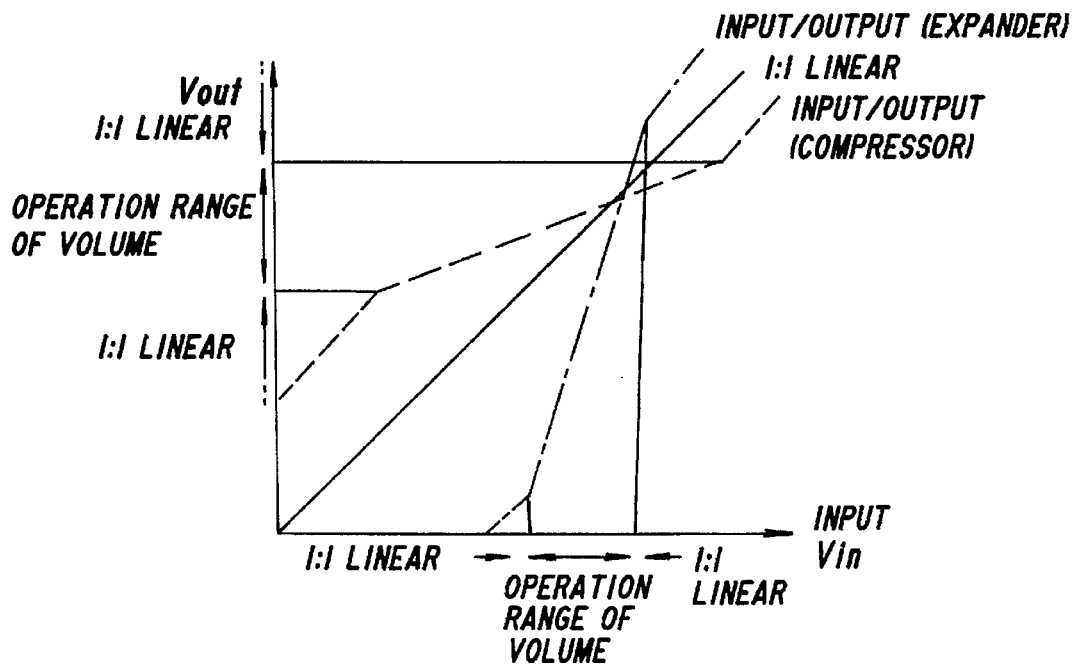
FIG. 20B is a graph of an input/output characteristic of a conventional compander circuit.

As has been described previously, the compressor characteristic is needed to cope with an excessive input. Meanwhile, the expander characteristic is needed to suppress ambient noise. More particularly, as shown in FIG. 20A, there is a case where the compressor characteristic is preferably selected when the input signal has a high level and the expander characteristic is preferably selected when the input signal has a low level. The fourth and fifth embodiments of the present invention which will be described below are compander circuits that have both the compressor characteristic and the expander characteristic. FIG. 20B shows the input/output characteristics of the compander circuit shown in FIG. 1.

Figure 21:
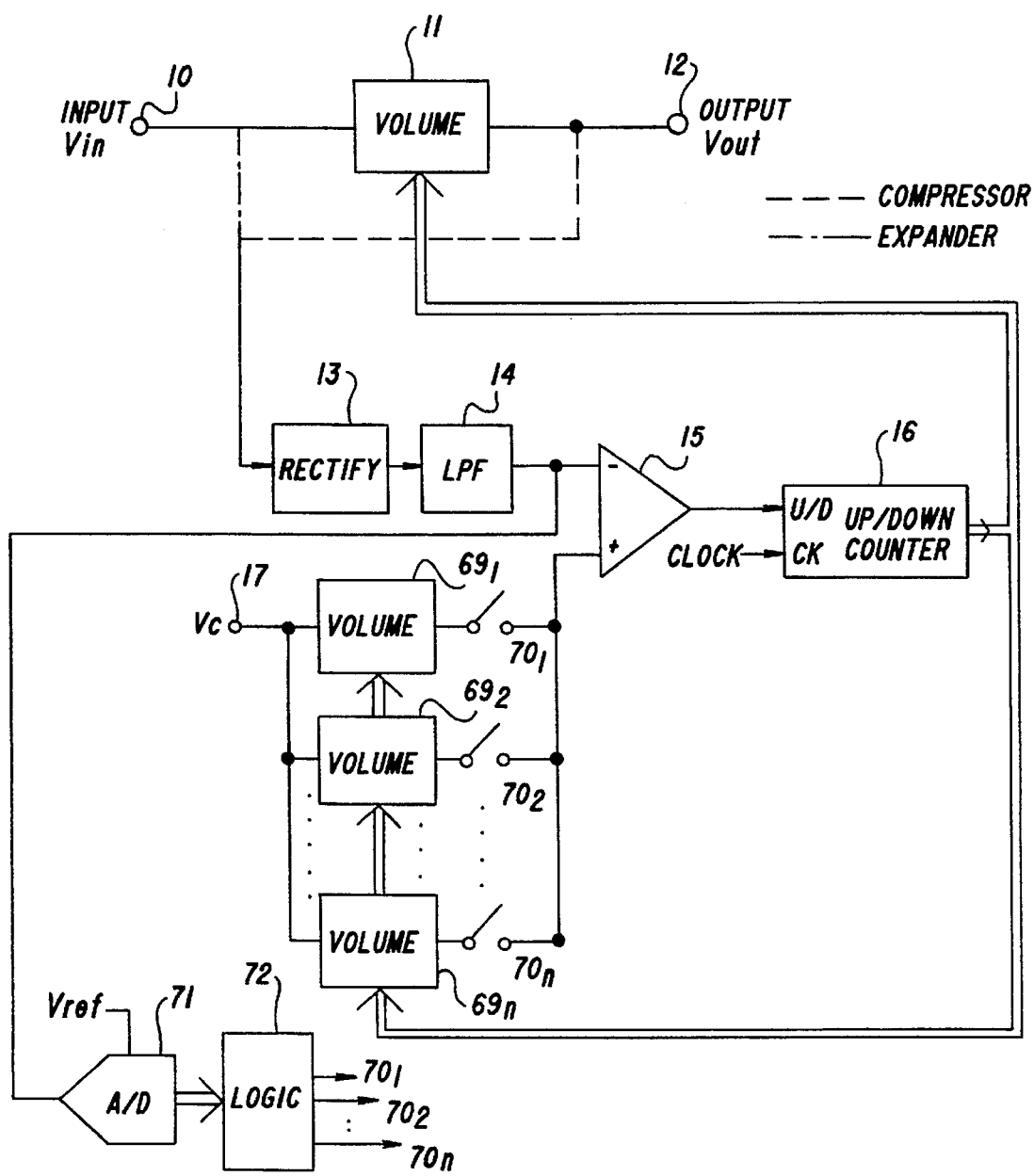
FIG. 21 is a block diagram of a fourth embodiment of the present invention.

FIG. 21 is a block diagram of the compander circuit according to the fourth embodiment of the present invention. In FIG. 21, parts that are the same as those shown in the previously described figures are given the same reference numbers, and a description thereof will be omitted here. When the connection indicated by the broken line is employed, the compander circuit shown in FIG. 21 has the circuit connection of the compressor. When the connection indicated by the one-dot chained line is employed, the compander circuit shown in FIG. 21 has the circuit connection of the expander. The compander circuit shown in FIG. 21 has both the compressor characteristic and the expander characteristic irrespective of which one of the two connections is employed.

As in the case of the first through third embodiments of the present invention, the structure shown in FIG. 21 includes the electronic volume controller 11, the rectifier circuit 13, the low-pass filter 14, the comparator 15 and the up/down counter 16. Further, the structure shown in FIG. 21 includes n electronic volume controllers $69_1$–$69_n$ (n is an integer), which are used in the aforementioned electronic volume controller 18. Furthermore, the structure shown in FIG. 21 includes switches $70_1$–$70_n$, an A/D converter 71 and a logic circuit 72. The constant voltage Vc is commonly applied to the electronic volume controllers $69_1$–$69_n$, which have different input/output characteristic (gains) with respect to the same counter value applied thereto. The switches $70_1$–$70_n$ are controlled by the logic circuit 72, which selects one of the electronic volume controllers $69_1$–$69_n$. The A/D converter 71 converts the output signal of the low-pass filter 14 into a digital signal by referring to a constant reference voltage Vref applied thereto. The digital signal output by the A/D converter 71 is output to the logic circuit 72, which outputs n bits to the switches $70_1$–$70_n$ in order to select one of the electronic volume controllers $69_1$–$69_n$.

Figure 22:
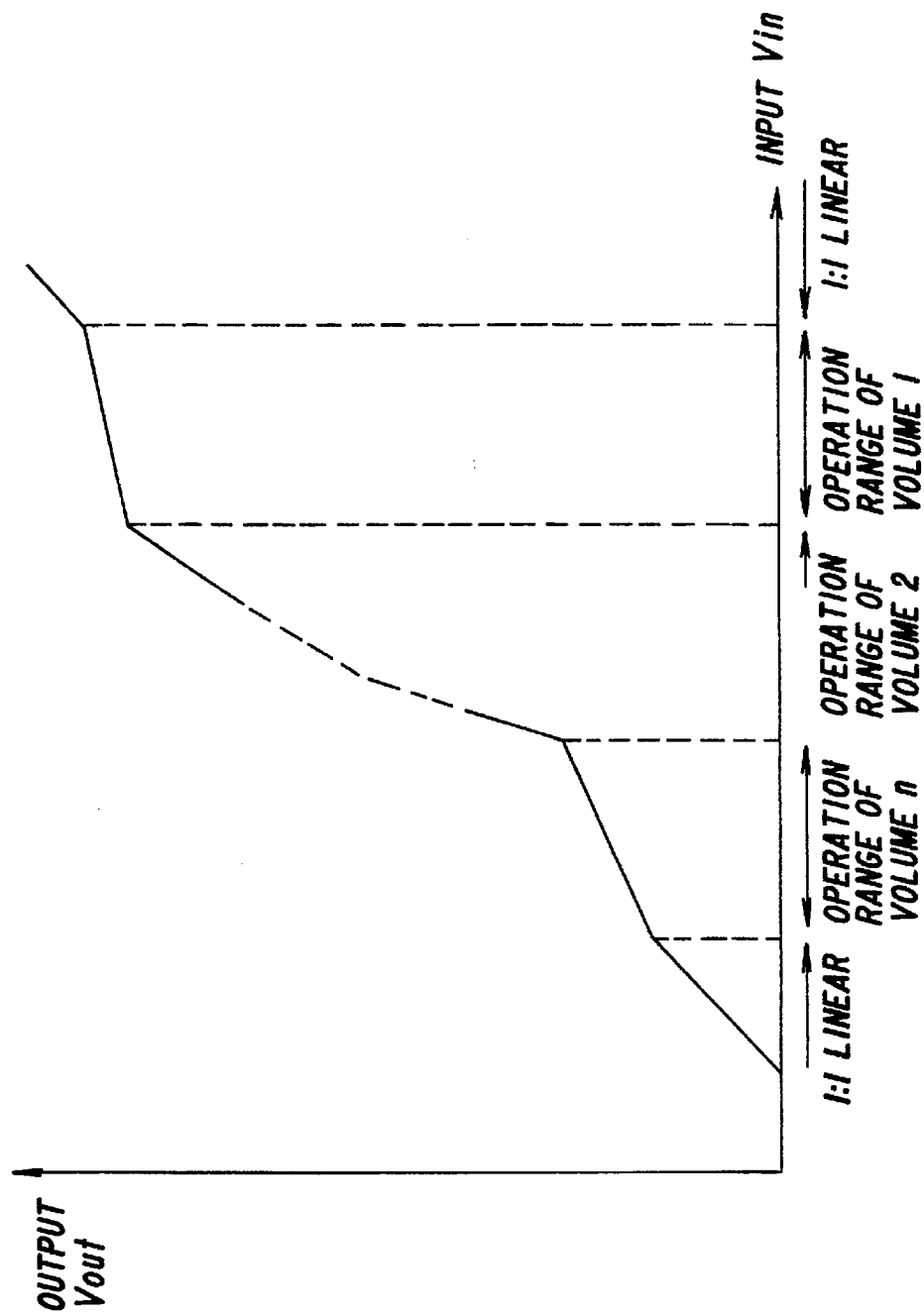
FIG. 22 is a graph of the input/output characteristic of the compander circuit shown in FIG. 21.

FIG. 22 is a graph of the input/output characteristic of the compander circuit 18 shown in FIG. 21 obtained when the expander connection (indicated by the one-dot chained line) is employed. As shown in FIG. 22, the operation ranges of the electronic volume controllers $69_1$–$69_n$ are determined. An input/output characteristic line having a slope less than that of the 1:1 linear input/output characteristic line is a compressor characteristic. An input/output characteristic line having a slope greater than that of the 1:1 linear input/output characteristic line is an expander characteristic. In the graph of FIG. 22, when either the electronic volume controller $69_1$ or $69_n$ is selected, the compander circuit functions as a compressor. When one of the electronic volume controllers $69_n$–$69_{n-1}$ is selected, the compander circuit functions as an expander.

Figure 23:
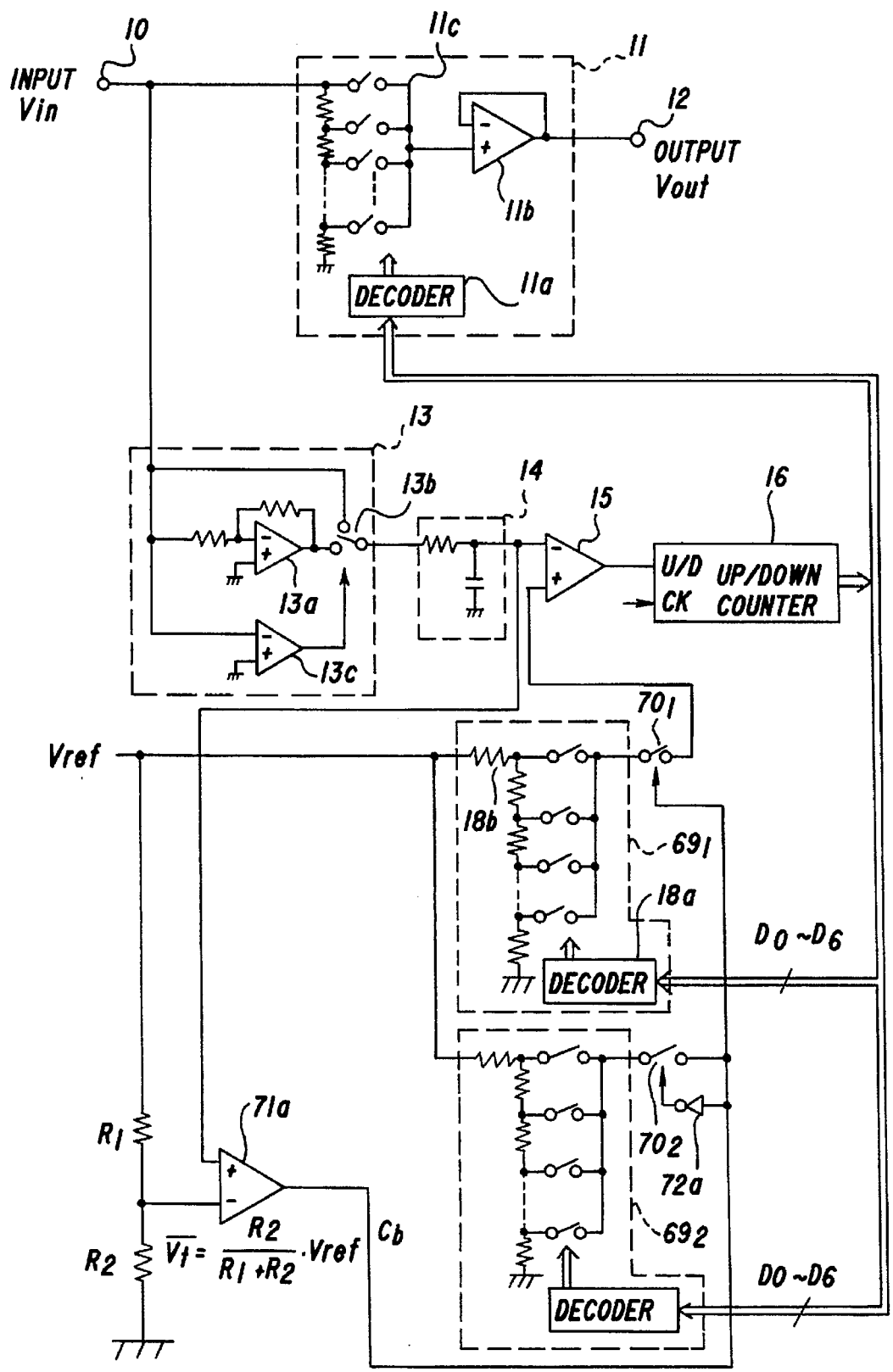
FIG. 23 is a block diagram of an expander circuit according to the fourth embodiment of the present invention.

FIG. 23 is a diagram of the compander circuit shown in FIG. 21 in which the expander circuit connection is employed. In FIG. 23, parts that are the same as those shown in the previously described figures are given the same reference numbers, and a description thereof will be omitted here. The structure shown in FIG. 23 includes two electronic volume controllers $69_1$ (electronic volume controller #1) and $69_2$ (electronic volume controller #2) (n=2). Each of the electronic volume controllers $69_1$ and $69_2$ includes decoder 18a for decoding the counter value of the up/down counter 16, and the network 18b having resistors and switches. The network 18b divides the constant reference voltage Vref according to the output signal of the decoder 18a. The decoders 19a of the electronic volume controllers $69_1$ and $69_2$ decode the same 7-bit counter value from the up/down counter 16, and output different decoded values. Hence, the decoders 19a of the electronic volume controllers $69_1$ and $69_2$ drive different switches to thereby produce different output voltages with respect to the same reference voltage Vref.

The A/D converter 71 includes two resistors R1 and R2 and a comparator 71a with respect to the two electronic volume controllers $69_1$ and $69_2$. A voltage applied to the inverting input terminal of the comparator $71_a$ is written as follows:

$$Vt=\{R2/(R1+R2)\}Vref.$$

The output voltage (which is the average value of the rectified waveform of the input signal Vin) of the low-pass filter 14 is applied to the non-inverting input terminal of the comparator 71a. If three or more electronic volume controllers for example are used, resistors other than the resistors R1 and R2 and a comparator other than the comparator 71a are provided. In this case, the output voltages Vt of the comparators are set to be different from each other.

The logic circuit 72 includes one inverter 72a with respect to the two electronic volume controllers $69_1$ and $69_2$. The inverter 7a inverts the output signal (labeled Cb) of the comparator 71a. The switch $70_2$ is controlled by the inverted version of the output signal Cb. The switch $70_1$ directly receives the output signal Cb.

Either the electronic volume controller $69_1$ or the electronic volume controller $69_2$ is selected by the A/D converter 71 and the logic circuit 72.

Figure 24A:
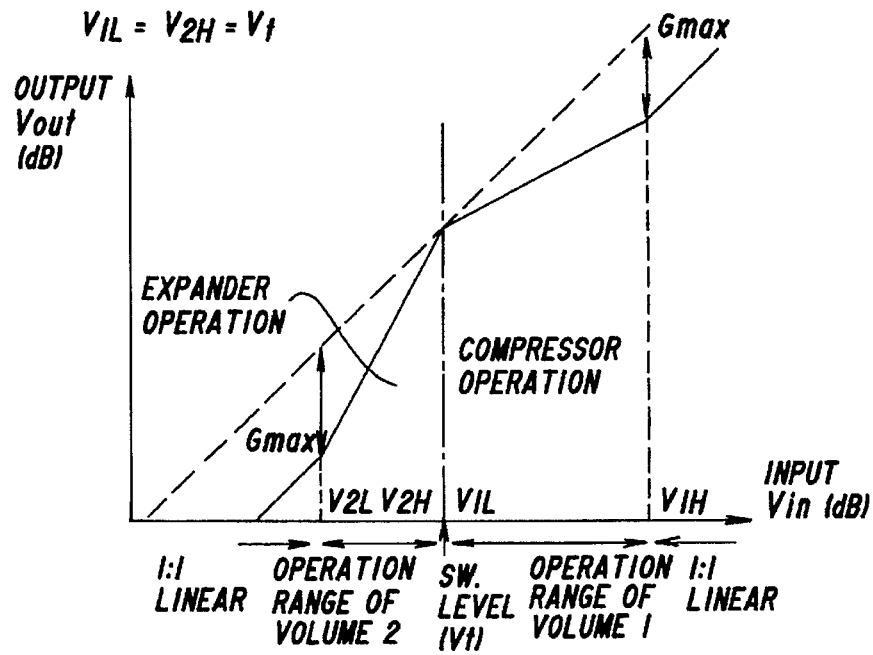
FIGS. 24A and 24B are graphs of input/output characteristics of the expander circuit shown in FIG. 23.
Figure 24B:
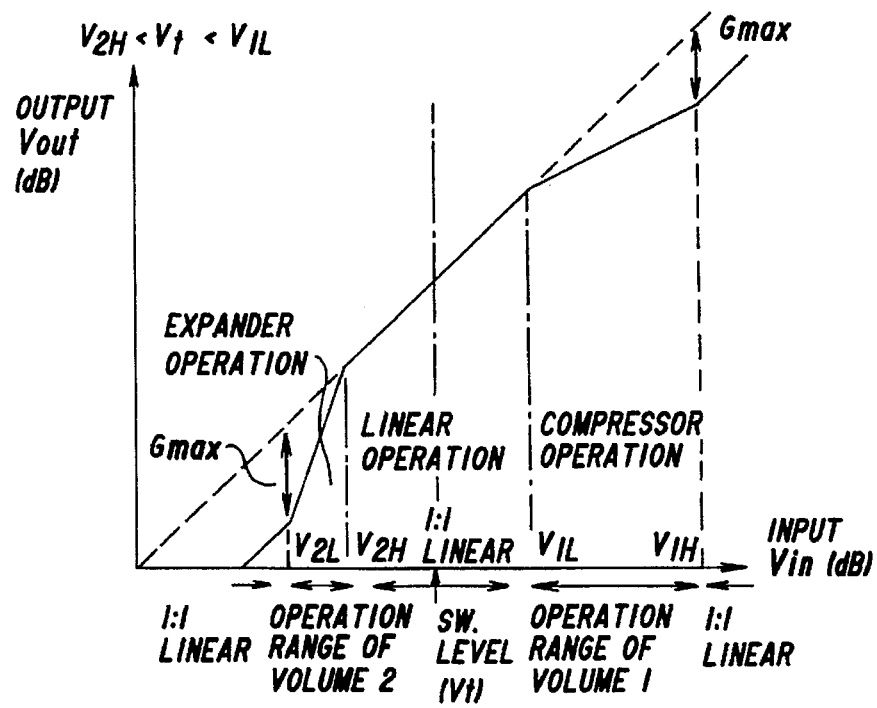

FIGS. 24A and 24B are graphs of the input/output characteristics of the expander circuit shown in FIG. 23. In these figures, the variable gain of the electronic volume controller 11 shown in FIG. 23 falls within the range between 0 (dB) and −Gmax (dB). The electronic volume controller $69_1$ has the DC voltage output range between V1L and V1H. The electronic volume controller $69_2$ has the DC voltage output range between V2L and V2H. Generally, a DC voltage Vdc output by a rectifier is the average voltage of the rectified value of an alternating voltage Vac, and is written as follows using the effective value of the alternating voltage: Vdc={ ($\sqrt{2}\sqrt{2}$)/ $\pi$}. In the following description, the level of the input signal Vin is the effective value thereof (the output signal of the low-pass filter 14).

FIG. 24 relates to a case where V1L=V2H=Vt. When the level of the input signal Vin is higher than the voltage Vt, the output signal of the electronic volume controller $69_1$ is applied to the comparator 15, which functions to decrease the gain of the electronic volume controller 11 as the level of the input signal Vin is increased. Hence, the slope of the input/output characteristic line is less than that of the 1:1 linear input/output characteristic line. Hence, the structure shown in FIG. 23 functions as the compressor. When the level of the input signal Vin is lower than the voltage Vt, the output signal of the electronic volume controller $69_2$ is applied to the comparator 15, which functions to decrease the gain of the electronic volume controller 11 as the level of the input signal Vin is lower. Hence, the slope of the input/output characteristic line is greater than that of the 1:1 linear input/output characteristic line. When the level of the input signal Vin becomes equal to Vt, the operation of the structure is switched from the expander operation to the compressor operation or vice versa. At this time, the gain of the electronic volume controller 11 is 0 dB. When the level of the input signal Vin is less than the voltage V2L or higher than V1H, the level of the input signal Vin is out of the operation ranges of the electronic volume controllers $69_1$ and $69_2$. In this case, the structure shown in FIG. 23 performs the 1:1 linear operation. In this case, the gains of the electronic volume controllers $69_1$ and $69_2$ are equal to −Gmax.

FIG. 24B relates to a case where V2H<Vt V1L. The structure shown in FIG. 23 functions as the compressor when V1L<Vin<V1H, and functions as the expander when V2L<Vin<V2H. When V2H<Vin<V1L, the input signal Vin is out of the operation range of the electronic volume controllers $69_1$ and $69_2$ irrespective of whether the electronic volume controller $69_1$ or $69_2$ is selected. In this case, the gain of the electronic volume controller 11 is fixed to 0 dB, and the linear operation is executed. It will be seen from FIG. 24B that the linear operation is sandwiched between the compressor operation and the expander operation.

Figure 25:
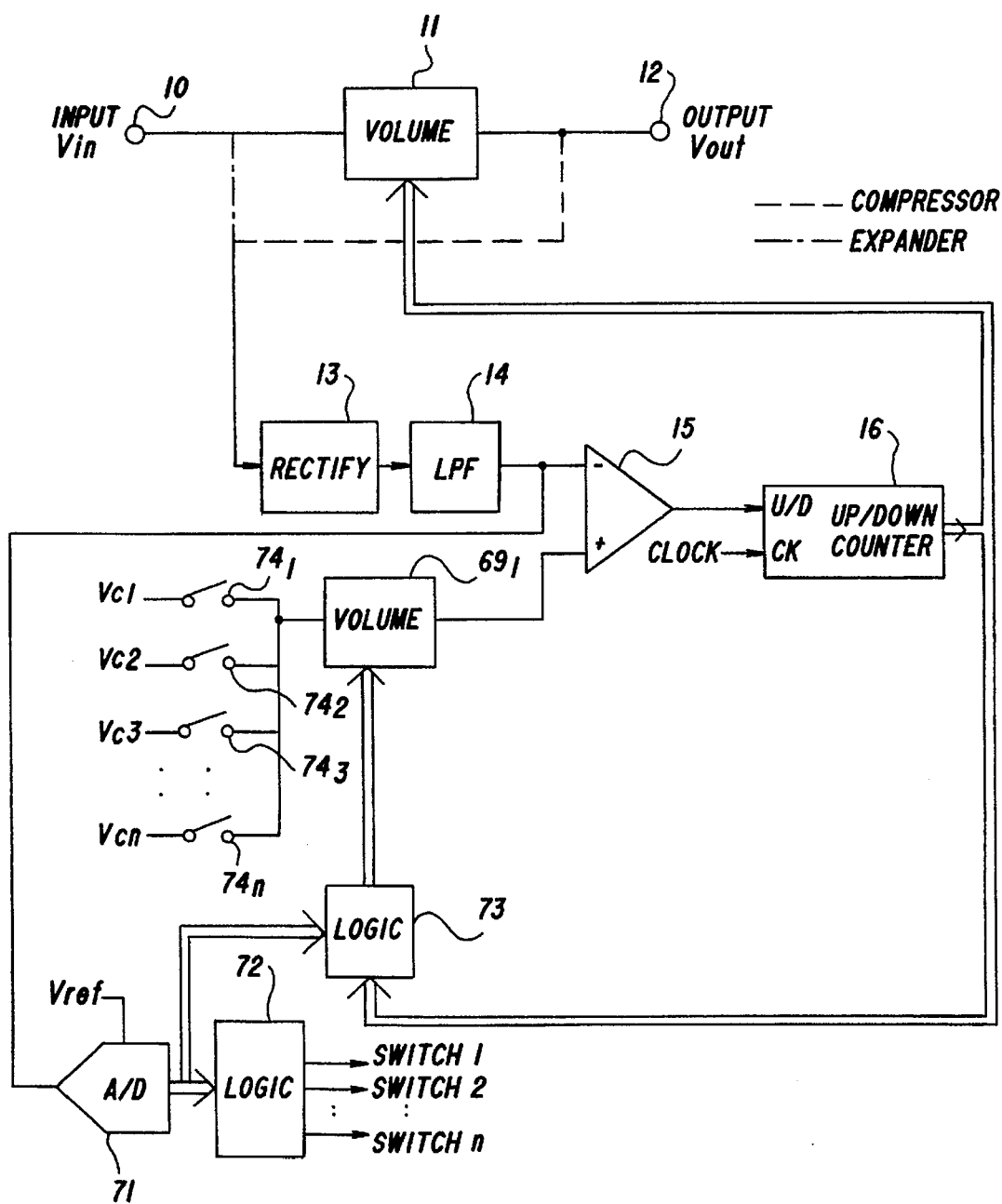
FIG. 25 is a block diagram of a fifth embodiment of the present invention.

FIG. 25 is a block diagram of a compander circuit according to a fifth embodiment of the present invention. In FIG. 25, parts that are the same as those shown in FIG. 21 are given the same reference numbers, and a description thereof will be omitted here. The structure shown in FIG. 25 is configured so as to provide the same function as that of the structure shown in FIG. 21 by means of the electronic volume controller $69_1$ only (which corresponds to the electronic volume controller 18) only.

One of constant voltages Vc1–Vcn having different values is applied to the electronic volume controller $69_1$ via one of switches $74_1$–$74_n$ where n is an integer. The switches $74_1$–$74_n$ are controlled by the output signal of the aforementioned logic circuit 72. A logic circuit 73 controls the gain of the electronic volume controller $69_1$ on the basis of the output signal of the A/D converter 71 and the counter value of the up/down counter 16.

Figure 26:
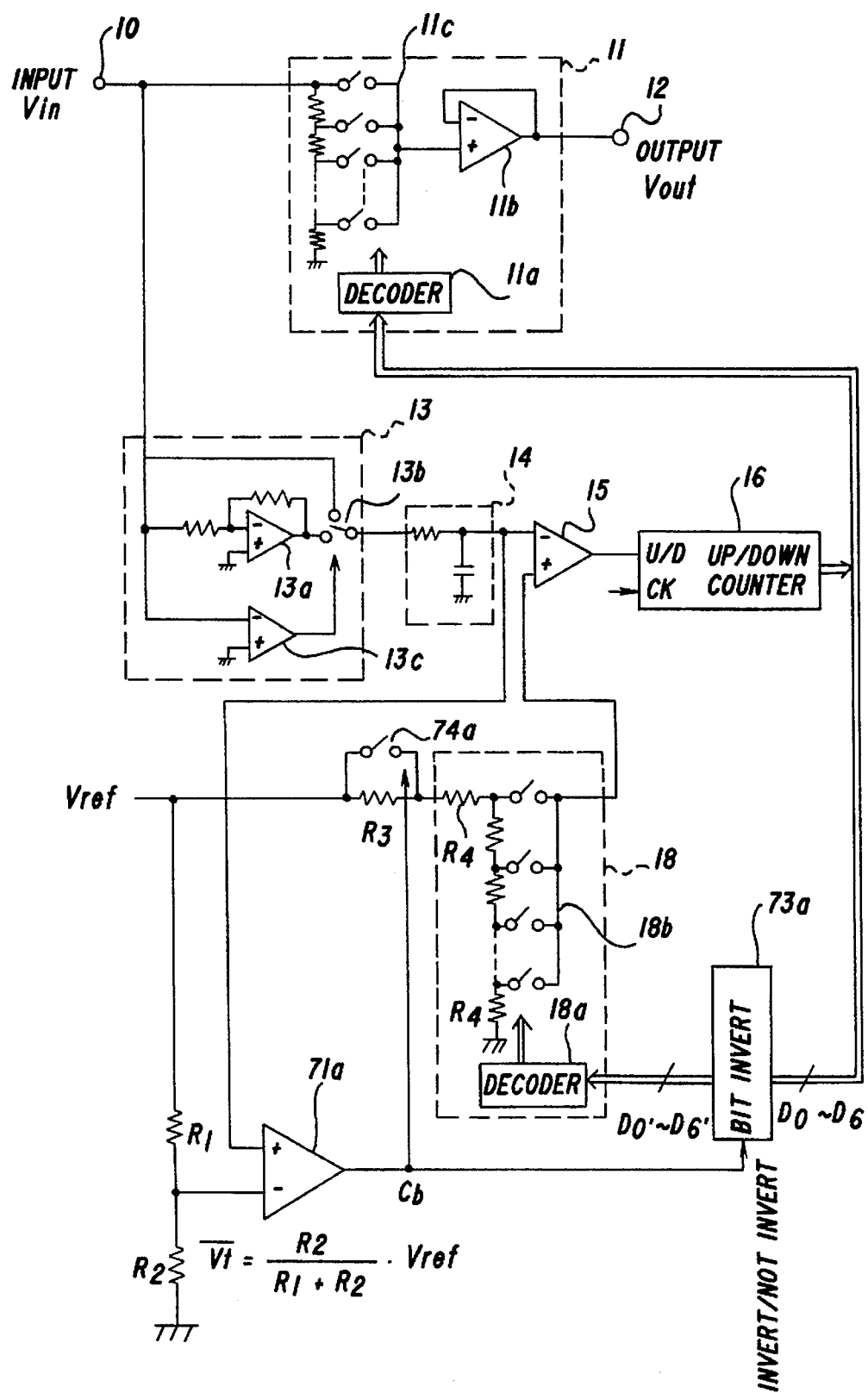
FIG. 26 is a block diagram of an expander circuit according to the fifth embodiment of the present invention.

FIG. 26 is a diagram of the compander circuit shown in FIG. 25 in which the expander connection is employed. In FIG. 26, parts that are the same as those shown in the previously described figures are given the same reference numbers. In the structure shown in FIG. 26, one of two different constant voltages is applied to the electronic volume controller 18 (which corresponds to the electronic volume controller $69_1$). A switch 74a is connected across the resistor R3. When the switch 74a is ON, the reference voltage Vref is applied directly to the electronic volume controller 18. When the switch 74a is OFF, a voltage lower than the reference voltage Vref by the voltage drop developing across the resistor R3 is applied to the electronic volume controller 18. The ON/OFF operation of the switch 74a is controlled by the output signal Cb of the comparator 71a.

The logic circuit 73 shown in FIG. 25 includes a bit inversion circuit 73a, which inverts the seven bits D6–D0 of the up/down counter 16 or allows through these bits without any modification in accordance with the level of the output signal of the comparator 71a. The output signals of the bit inversion circuit 73a are denoted as D6'–D0'.

The expander circuit shown in FIG. 26 operates in the same way as the expander circuit shown in FIG. 23. That is, the expander shown in FIG. 26 has the characteristics shown in FIGS. 24A and 24B. When the level of the input signal Vin is higher than the voltage Vt, the switch 74a is turned ON, and the electronic volume controller 18 is set to have the operation range between V1L and V1H. When the level of the input signal Vin falls within the above operation range, the expander circuit shown in FIG. 26 functions as the compressor. When the level of the input signal Vin is lower than the voltage Vt, the switch 74a is turned OFF, and the electronic volume controller 18 is set to have the operation range between V2L and V2H. When the level of the input signal Vin falls within the above operation range, the expander circuit shown in FIG. 26 functions as the expander. However, it will be noted that it is necessary to invert the voltage relationship with respect to the counter value of the up/down counter 16 in order to realize both the compressor operation and the expander operation by means of the single electronic volume controller 18. Hence, the bit inversion circuit 73a is used to selectively invert the bits D6–D0 in response to the output signal Cb of the comparator 71a.

Figure 27:
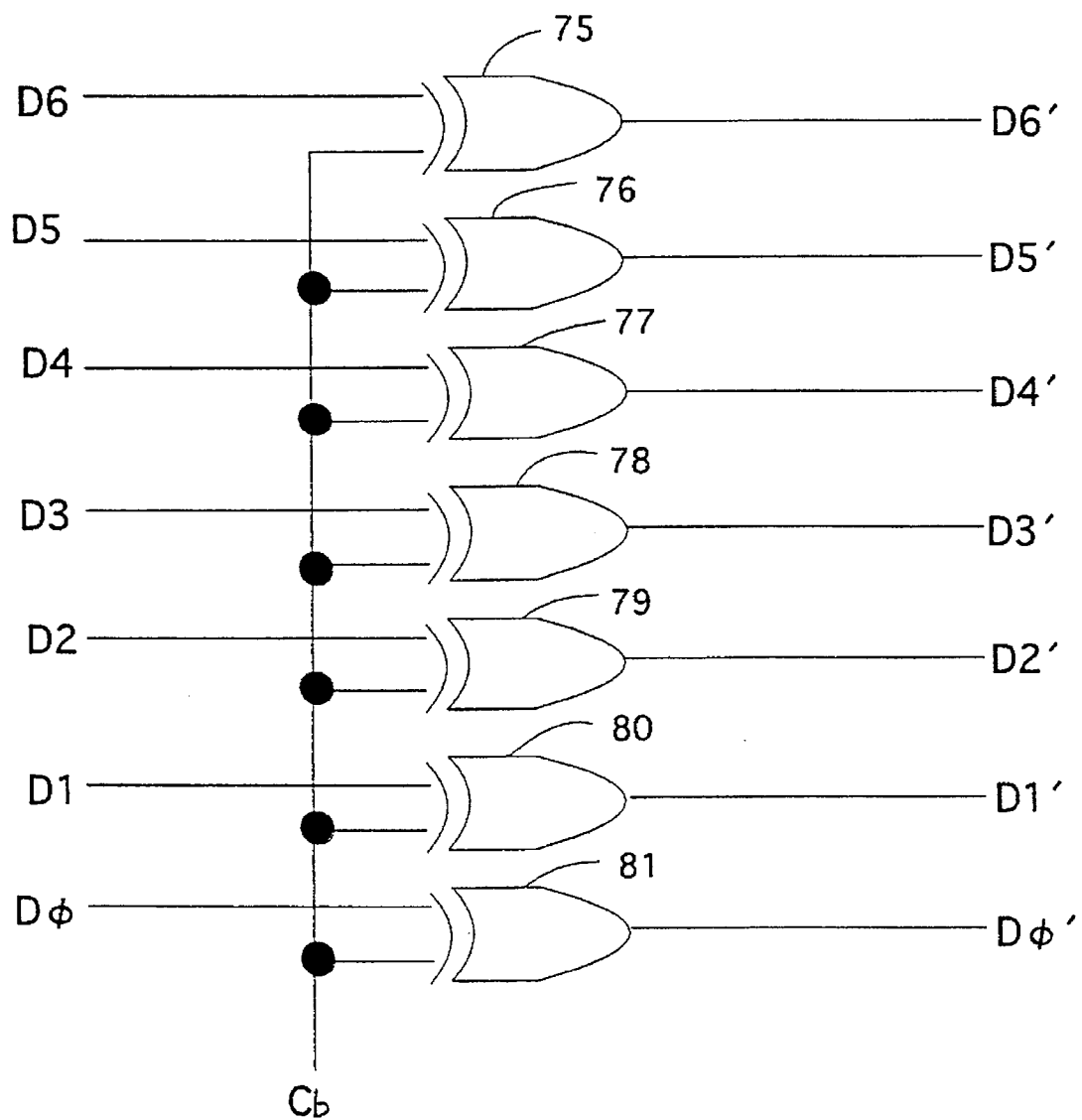
FIG. 27 is a block diagram of a bit inversion circuit shown in FIG. 26.

FIG. 27 is a circuit diagram of an example of the structure of the bit inversion circuit 73a shown in FIG. 26. The bit inversion circuit 73a is made up of exclusive-OR gates 75–81, which respectively receive the bits D6–D0 of the up/down counter 16 and the control signal Cb of the comparator 71a, and outputs the inverted versions D6'–D0' thereof. When the output signal Cb of the comparator 71a is high, the counter values D6–D0 are inverted. When the output signal Cb is low, the counter values D6–D0 are inverted.

According to the fourth and fifth embodiments of the present invention, it is possible to provide input/output characteristics having the 1:1 linear characteristic, the compressor characteristic and the expander characteristic. Similar input/output characteristics can be obtained by the compander circuit in which the compressor connection is employed. In this case, the electronic volume controller shown in FIG. 10 is used.

Figure 28:
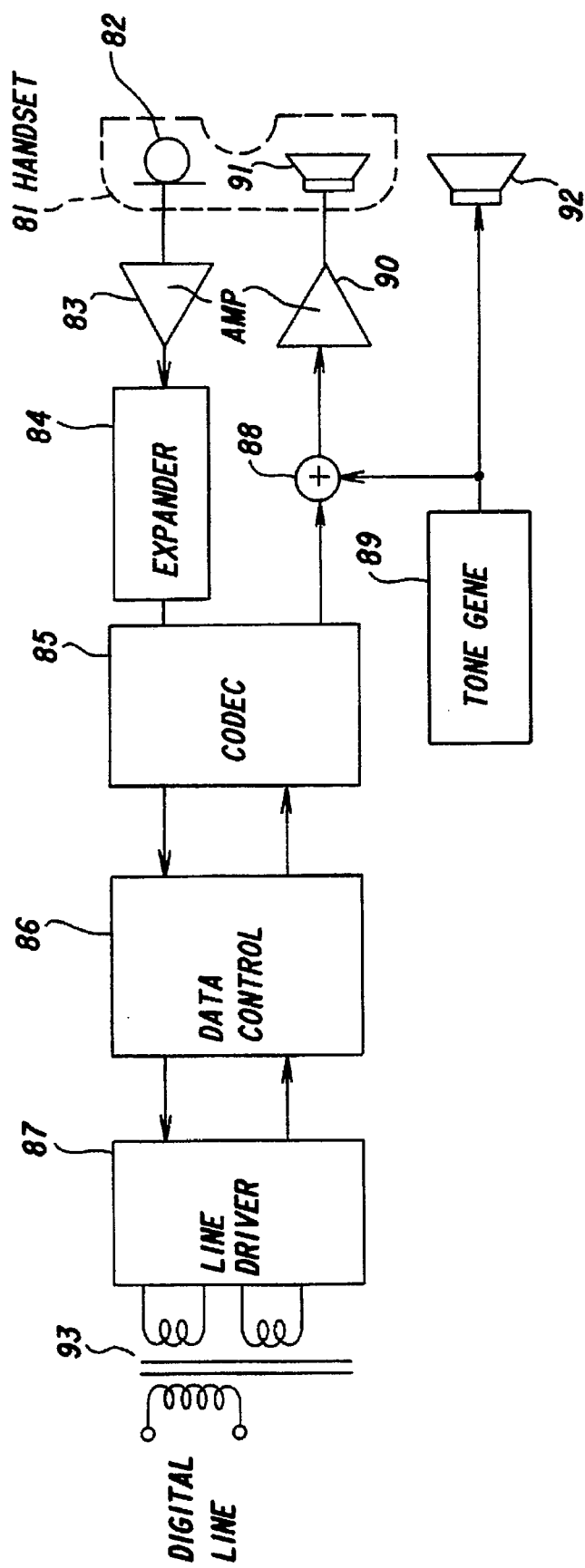
FIG. 28 is a block diagram of a communications device to which the fourth and fifth embodiments of the present invention can be applied.

The fourth and fifth embodiments of the present invention can be applied to a voice transmission system of a digital telephone set, as shown in FIG. 28. The voice transmission system of the digital telephone set shown in FIG. 28 includes a microphone 82 of a handset 81, an amplifier (AMP) 83, and an expander circuit 84. The expander circuit 84 is configured according to the fourth or fifth embodiment of the present invention. When the level of the voice signal from the amplifier 83 is large, the expander circuit 84 has the compressor characteristic. When the level of the voice signal from the amplifier 83 is small, the expander circuit 84 has the expander characteristic. With the expander circuit 84, it becomes possible to prevent the excessive input and suppress the ambient noise by means of the single expander (compressor) circuit.

The digital telephone set further includes a codec (CODEC) 85, a data controller 86, a line driver 87, an adder 88, a tone generating circuit 89, an amplifier 90, a receiver 91, a speaker 92 and a transformer 93 forming an interface between a two-wire line circuit forming a digital line and a four-wire line circuit. The output signal of the expander circuit 84 is encoded by the codec 85, and is subjected to a predetermined transmit data control process by the data controller 86. Then, the output signal of the data controller 86 is transmitted over the digital line via the line driver 87 and the transformer 93. A digital signal received from the digital line passes through the transformer 93 and the line driver 87, and is subjected to a predetermined receive data control process by the data controller 86. The output signal of the data controller 86 is then decoded by the codec 85. The decoded signal is then output to the receiver 91 via the adder 88 and the amplifier 90. The tone generating circuit 89 outputs a tone signal to the adder 88 and the speaker 92.

A description will now be given of a sixth embodiment of the present invention.

As has been described previously, the compander circuit shown in FIG. 1 has a disadvantage in that the output level of the low-pass filter 14 frequently switches to the high and low levels if the target output level of the electronic volume controller 18 is not equal to any of the possible output levels thereof. This causes noise superimposed on the output signal Vout.

Figure 1:
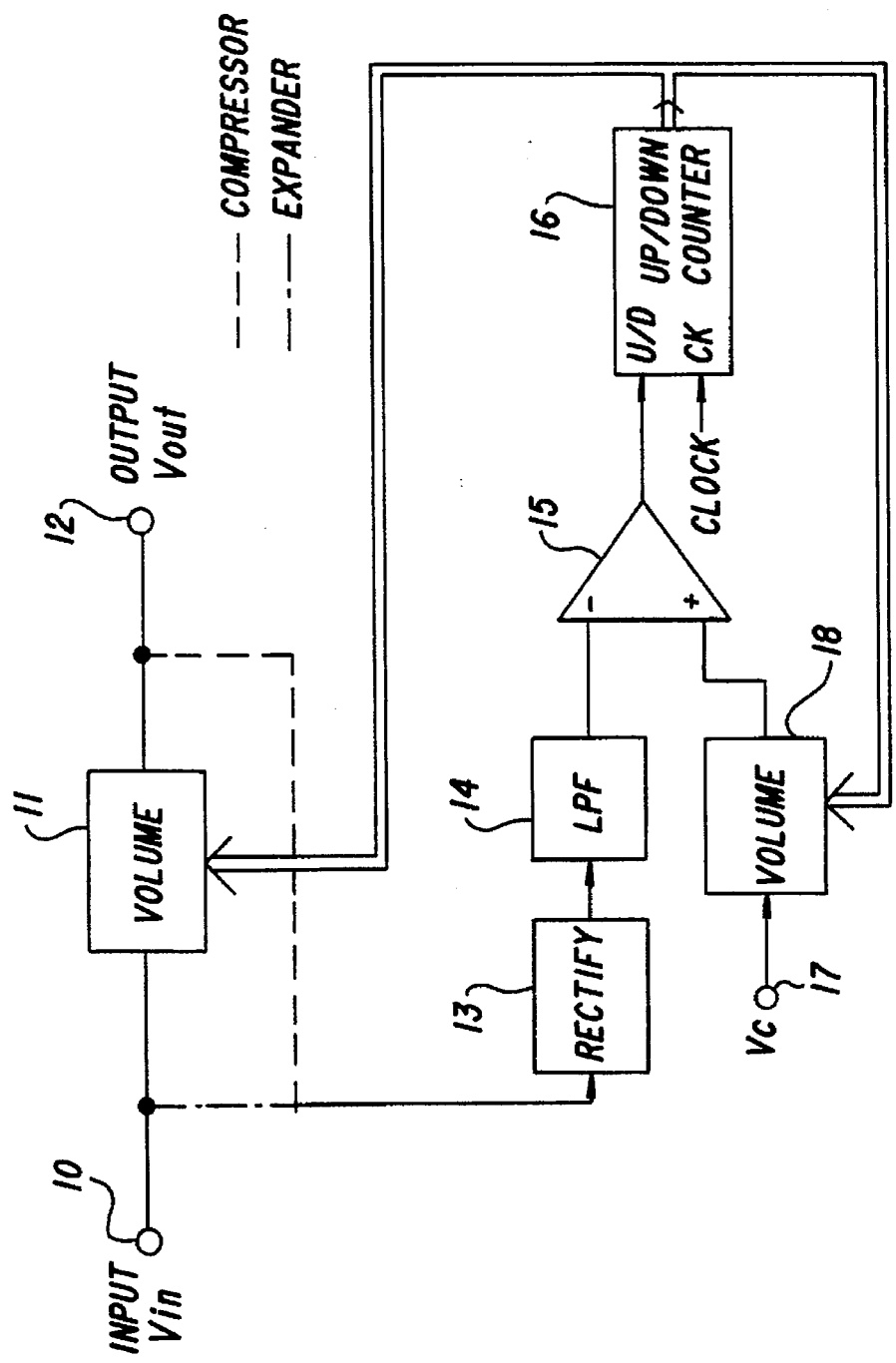
FIG. 1 is a block diagram of a conventional compander circuit.
Figure 2:
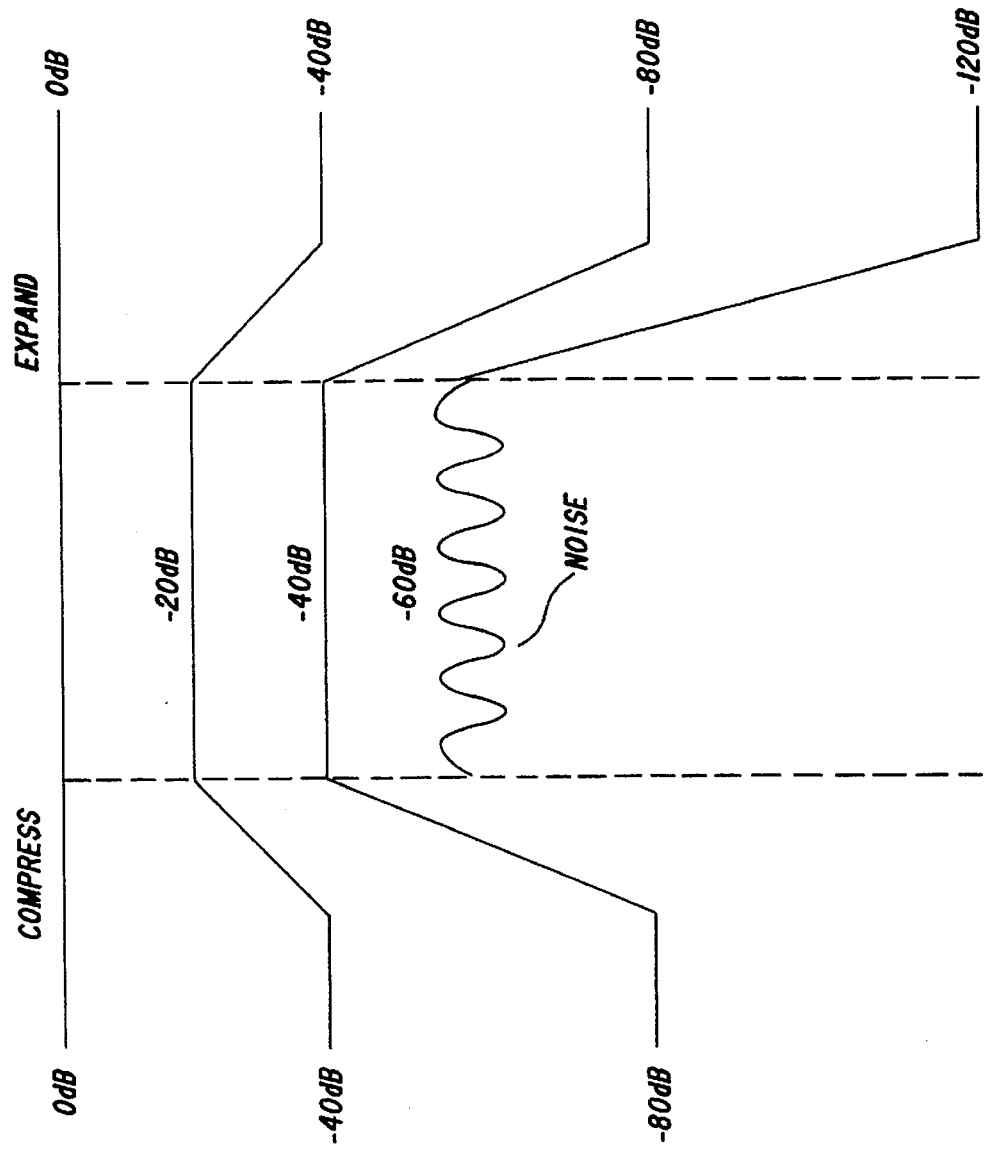
FIG. 2 is a diagram for explaining a compressor characteristic and an expander characteristic.
Figure 3A:
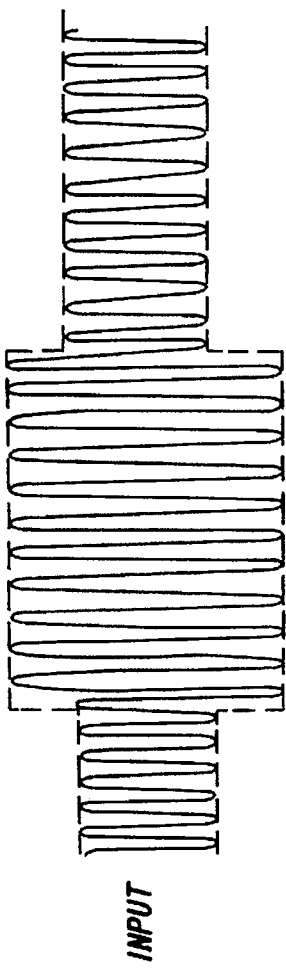
FIGS. 3A, 3B and 3C are waveform diagrams of a compressor operation and an expander operation.
Figure 3B:
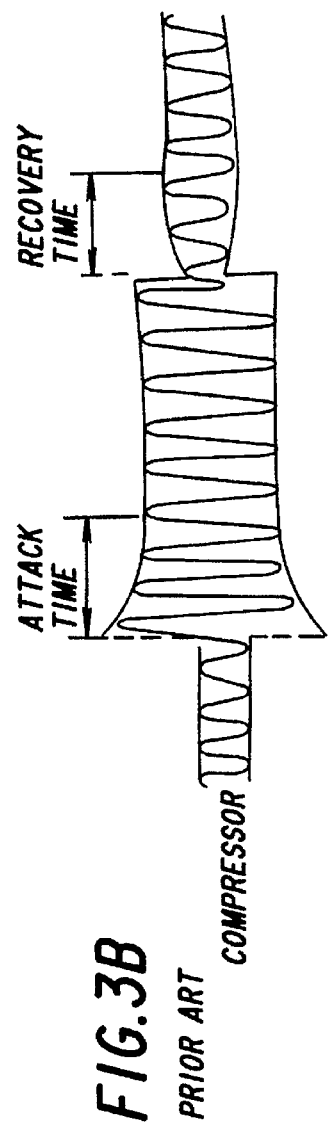
Figure 3C:
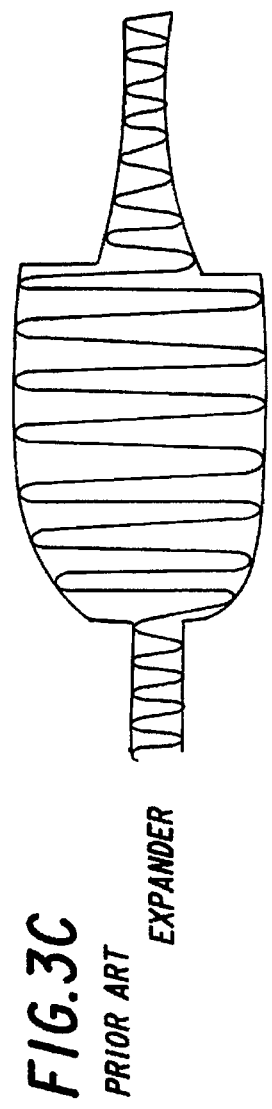

In order to eliminate the above disadvantage, the sixth embodiment of the present invention is configured so that, as shown in FIG. 29A, an overflow counter 131 and a clock supply control circuit 133 are added to the compressor circuit shown in FIG. 1. In FIG. 29A, parts that are the same as those shown in FIG. 1 are given the same reference numbers, and a description thereof will now be omitted here.

In the compressor circuit shown in FIG. 29A, the output signal of the comparator 15 is applied to a data input terminal DATA of the overflow counter 131, which receives, via its clock terminal CK, a clock signal CK1 (which is the same as the aforementioned clock signal CK) applied to a terminal 132. A signal O1 output by the overflow counter 131 is supplied to the up/down count control terminal U/D of the up/down counter 16, and a signal output thereby is supplied to the clock supply control circuit 133. The clock supply control circuit 133 supplies the clock terminal CK of the up/down counter 16 with the clock signal CK1 applied to the terminal 132 during the time when the signal O2 is low.

Figure 30:
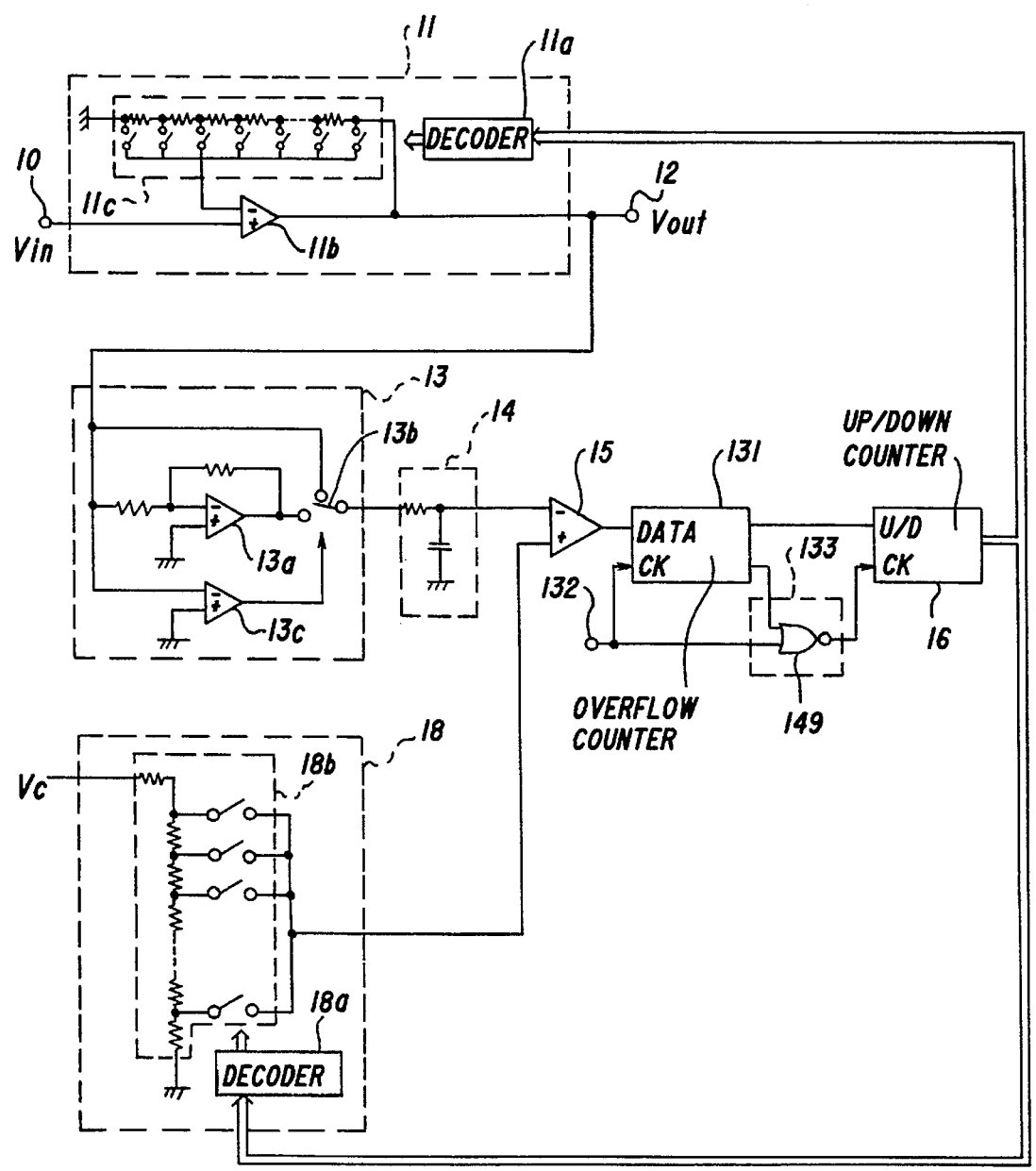
FIG. 30 is a block diagram of the detail of the compressor circuit shown in FIG. 29A.

FIG. 30 shows the detail of the structure shown in FIG. 29A. In FIG. 30, parts that are the same as those shown in the previously described figures are given the same reference numbers. The clock supply control circuit 133 includes a NOR gate 149. The detail of the overflow counter 131 will be described later.

FIG. 29B shows an expander according to the sixth embodiment of the present invention. The expander shown in FIG. 29B includes an input terminal 120, an electronic volume controller 121, an output terminal 122, a rectifier circuit 123, a low-pass filter (LPF) 124, a comparator 125, an up/down counter 126, a control terminal 127 and an electronic volume controller 128. Further, the expander shown in FIG. 29B includes an overflow counter 135, a terminal 136 and a clock supply control circuit 137. The structure shown in FIG. 29B is the same as that shown in FIG. 29A in that the rectifier circuit 123 directly receives the input signal Vin.

Figure 31:
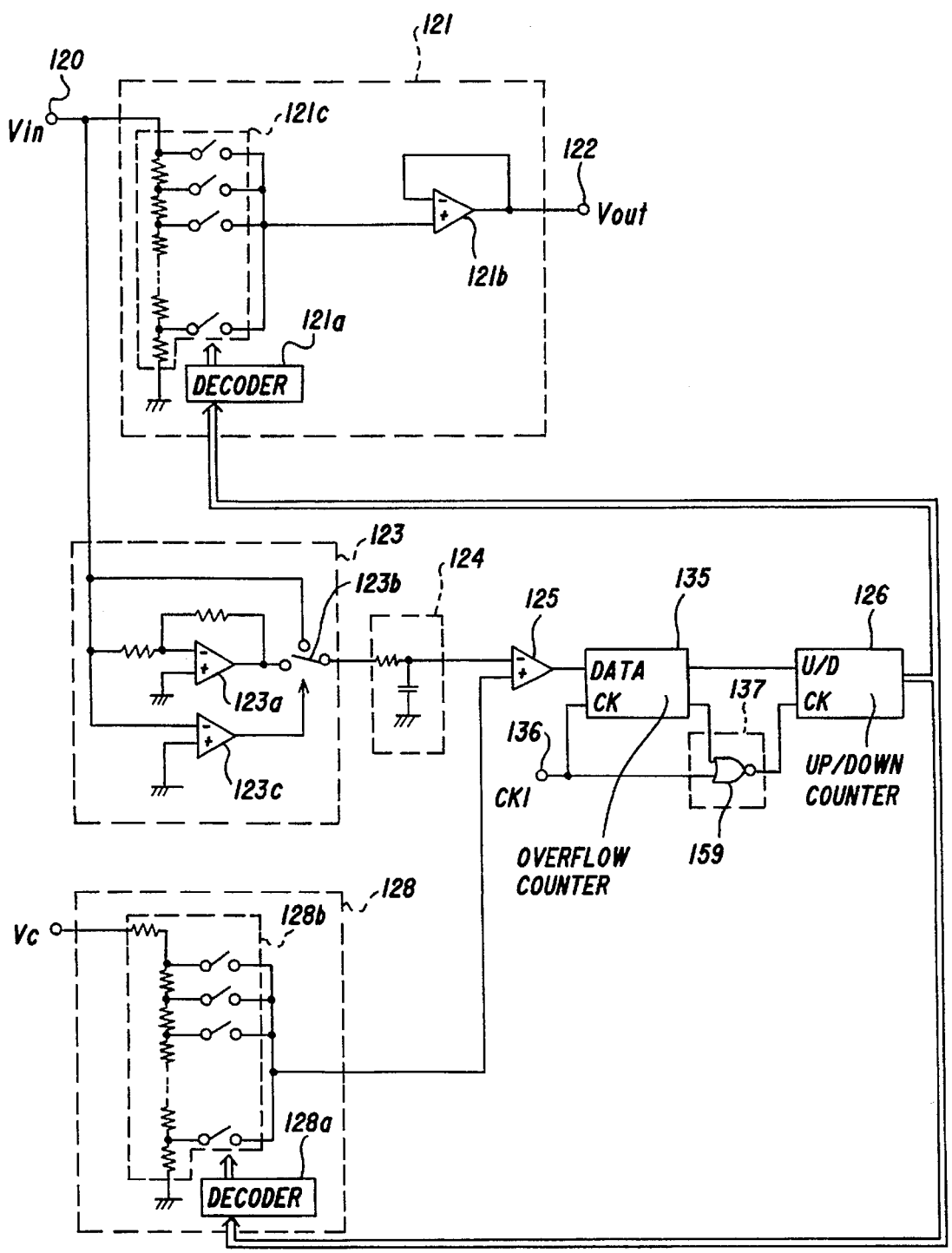
FIG. 31 is a block diagram of the detail of the expander circuit shown in FIG. 29B.

FIG. 31 shows the detail of the structure shown in FIG. 29B. In FIG. 31, parts that are the same as those shown in the previously described figures are given the same reference numbers. The clock supply control circuit 133 includes a NOR gate 159, which is the same as the NOR gate 149 shown in FIG. 30.

Figure 32:
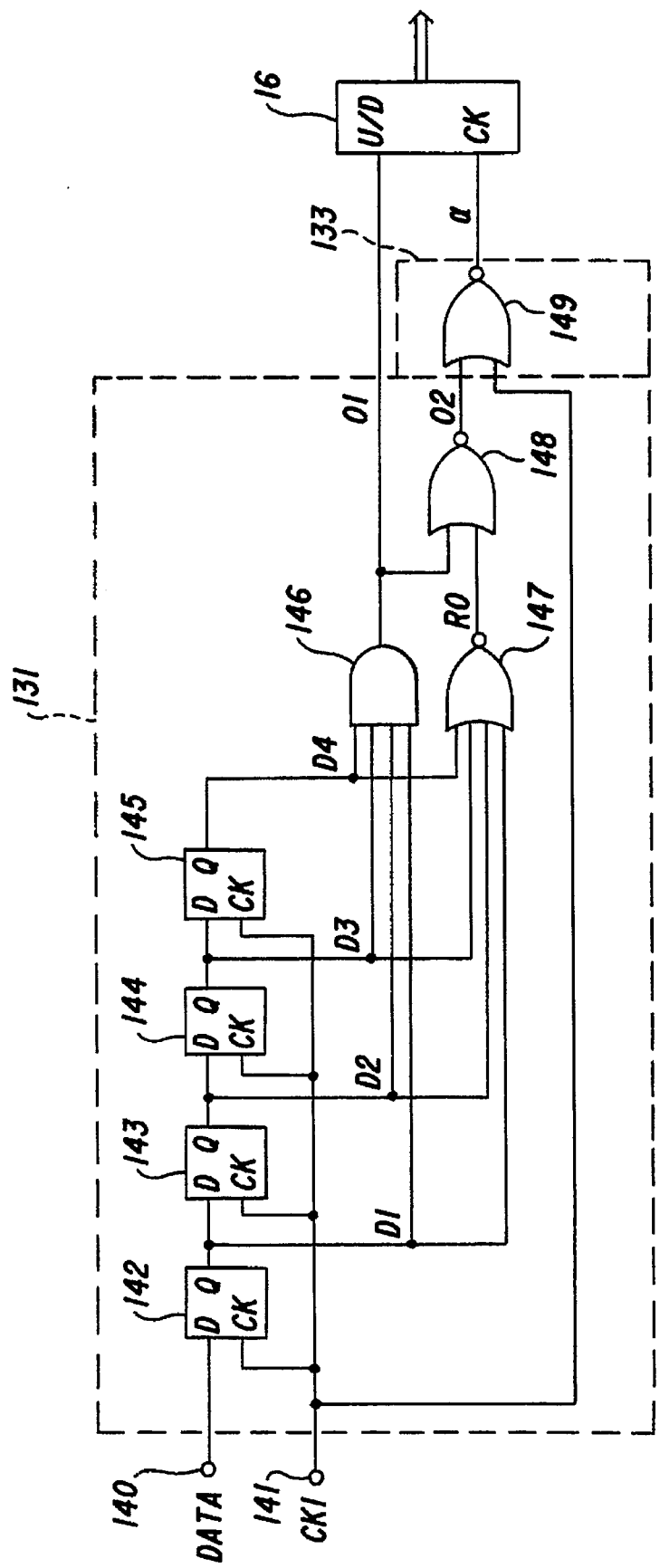
FIG. 32 is a block diagram of essential parts of the sixth embodiment of the present invention.

FIG. 32 is a circuit diagram of the overflow counter 131 and the clock supply control circuit 133 shown in FIGS. 29A and 30. The overflow counter 135 and the clock supply control circuit 137 shown in FIGS. 29B and 31 have the same structures as shown in FIG. 32.

Figure 33:
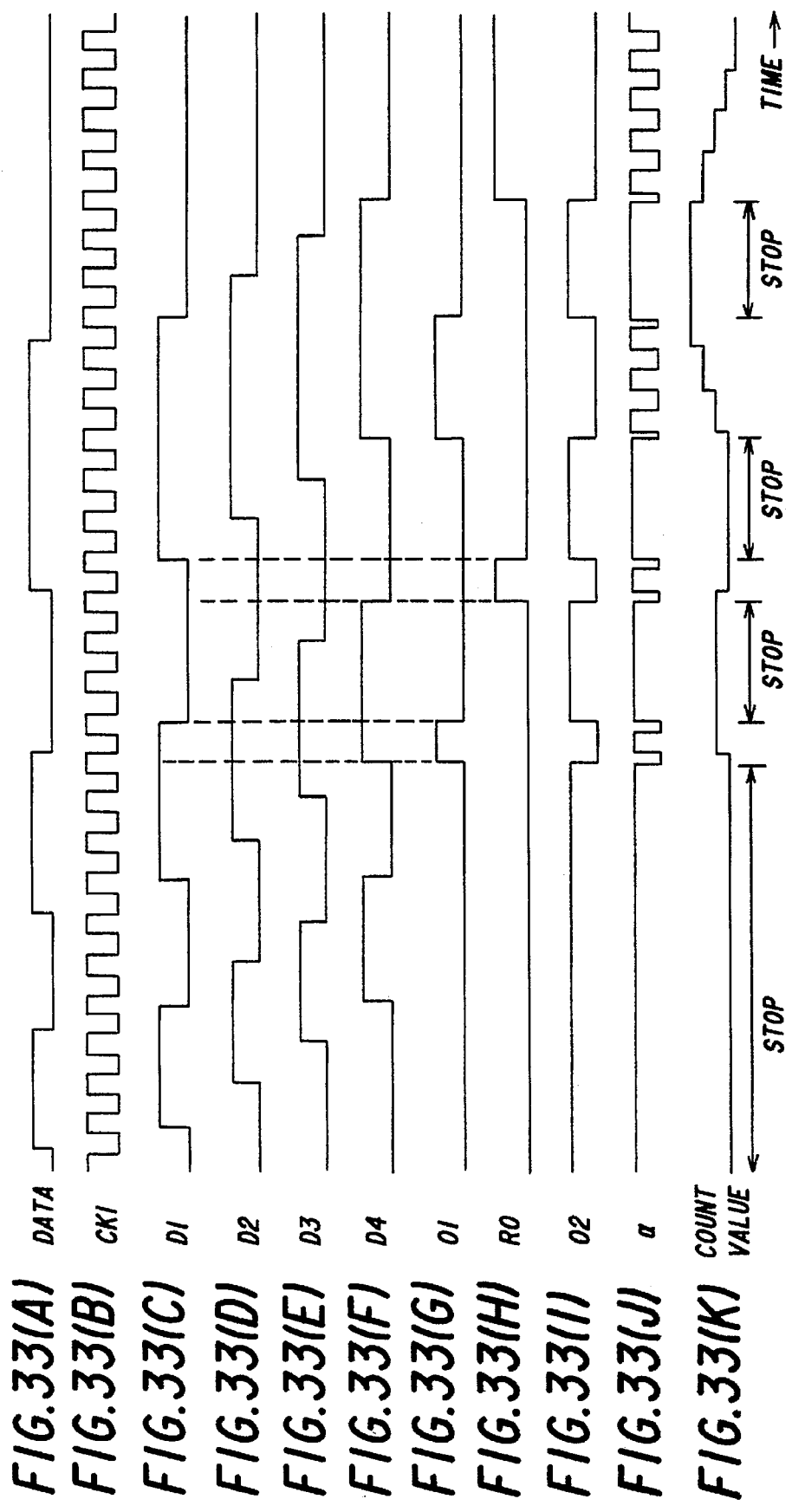
FIG. 33 is a timing chart of the operation of the structure shown in FIG. 32.

In the operation of the circuit shown in FIG. 32, the output signal DATA of the comparator 15 as shown in (A) of FIG. 33 is applied to a data input terminal D of a D-type flip-flop 142 of the overflow counter 131. The clock signal CK1 as shown in (B) of FIG. 33 is applied to a terminal 141, and is then applied to clock terminals CK of cascaded D-type flip-flops 142, 143, 144 and 145. The flip-flop 142 outputs a one-cycle delayed version D1 of the signal DATA applied to the terminal 140, as shown in (C) of FIG. 33. The flip-flop 143 outputs a two-cycle delayed version D2 of the signal DATA, as shown in (D) of FIG. 33. The flip-flop 144 outputs a three-cycle delayed version D3 of the signal DATA, as shown in (E) of FIG. 33. The flip-flop 145 outputs a four-cycle delayed version D4 of the signal DATA, as shown in (F) of FIG. 33.

The signals D1–D4 are applied to AND gates 146 and 147. The AND gate 146 produces a level instruction signal O1 shown in (G) of FIG. 33 which is switched to the high level when the signal DATA continues to be high for the four clock cycles or more. The level instruction signal O1 is applied to the up/down count control terminal U/D of the up/down counter 16 and a NOR gate 148. The NOR gate 147 produces a signal R0 shown in (H) of FIG. 33 which is switched to the high level when the signal DATA continues to be low for the four clock cycles or more. The signal R0 is applied to the NOR gate 148. The NOR circuit 148 produces an extraction enable signal O2 which is switched to the low level when either the signal O1 or the signal RO is at the high level. The signal O2 is applied to the NOR circuit 149 forming the clock supply control circuit 133. The NOR circuit 149 inverts the clock signal CK1 supplied via the terminal 141 only when the signal O2 is low, and outputs an extraction clock signal e shown in (J) of FIG. 33. This clock signal e is applied to the clock terminal CK of the up/down counter 16.

The up/down counter 16 is not supplied with the clock signal when the signal O2 is high. In this case, the up/down counter 16 is paused to execute the count operation. When the signal O1 is high, the up/down counter 16 performs the up-count operation on the extraction clock signal e. When the signal R0 is high, the up/down counter 16 performs the down-count operation o the extraction clock signal e. In this manner, the counter value of the up/down counter 16 changes as shown in (K) of FIG. 33.

The overflow counter 131 and the clock supply control circuit 133 enables the up/down counter 16 to perform the up or down count operation only when the signal DATA continues to be high or low for the four cycles or more. Hence, it is possible to prevent the unnecessary variation of the count value of the up/down counter 16 due to a ripple component contained in the output signal of the low-pass filter 14 as well as the stepwise variation of the output signal of the electronic volume controller 18 and to hence prevent the output signal Vout from containing noise. The above effects can be obtained in the expander shown in FIGS. 29B and 31.

Figure 34:
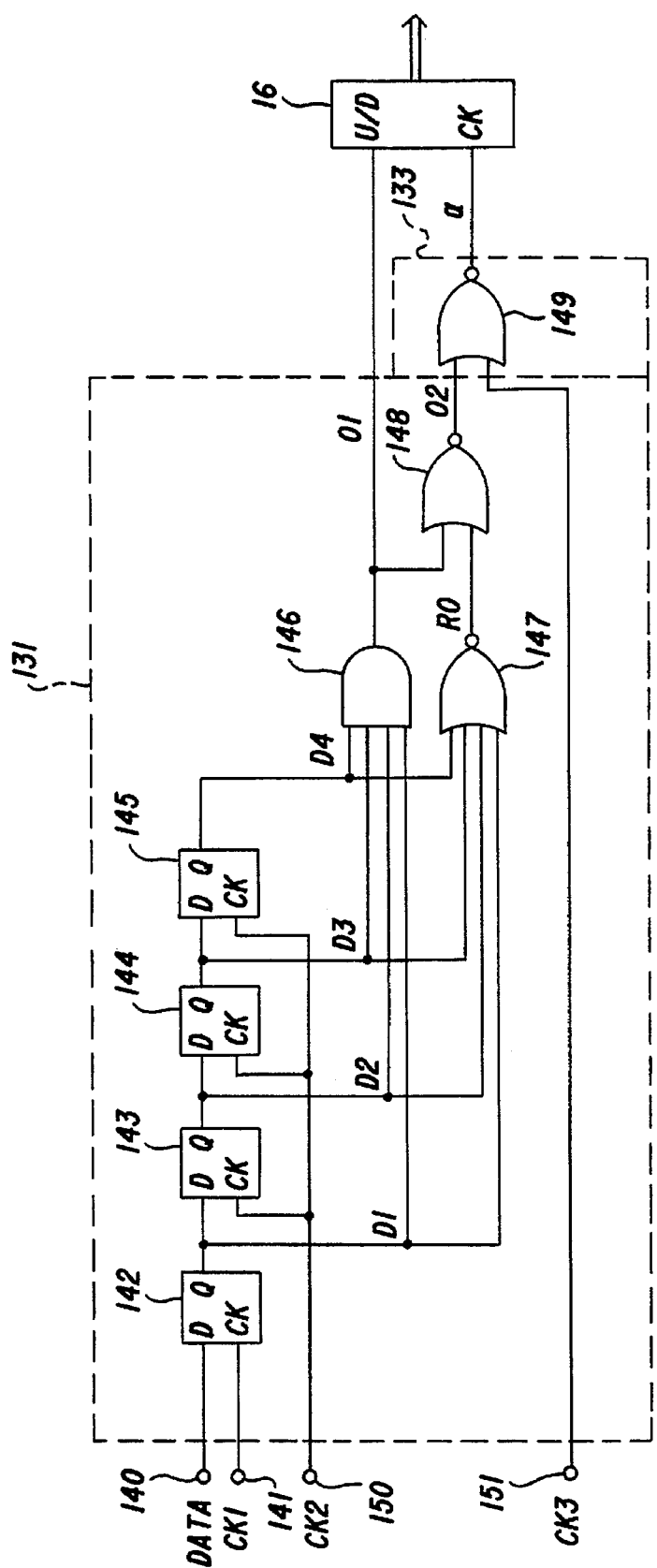
FIG. 34 is a block diagram of a version of the structure shown in FIG. 32.

In the structure shown in FIG. 32, the clock signal CK1 is commonly supplied to the flip-flops 142–145 and the NOR gate 149. Instead of the above, it is possible to employ an alternative structure as shown in FIG. 34. In FIG. 34, parts that are the same as those shown in FIG. 32 are given the same reference numbers.

Figure 35:
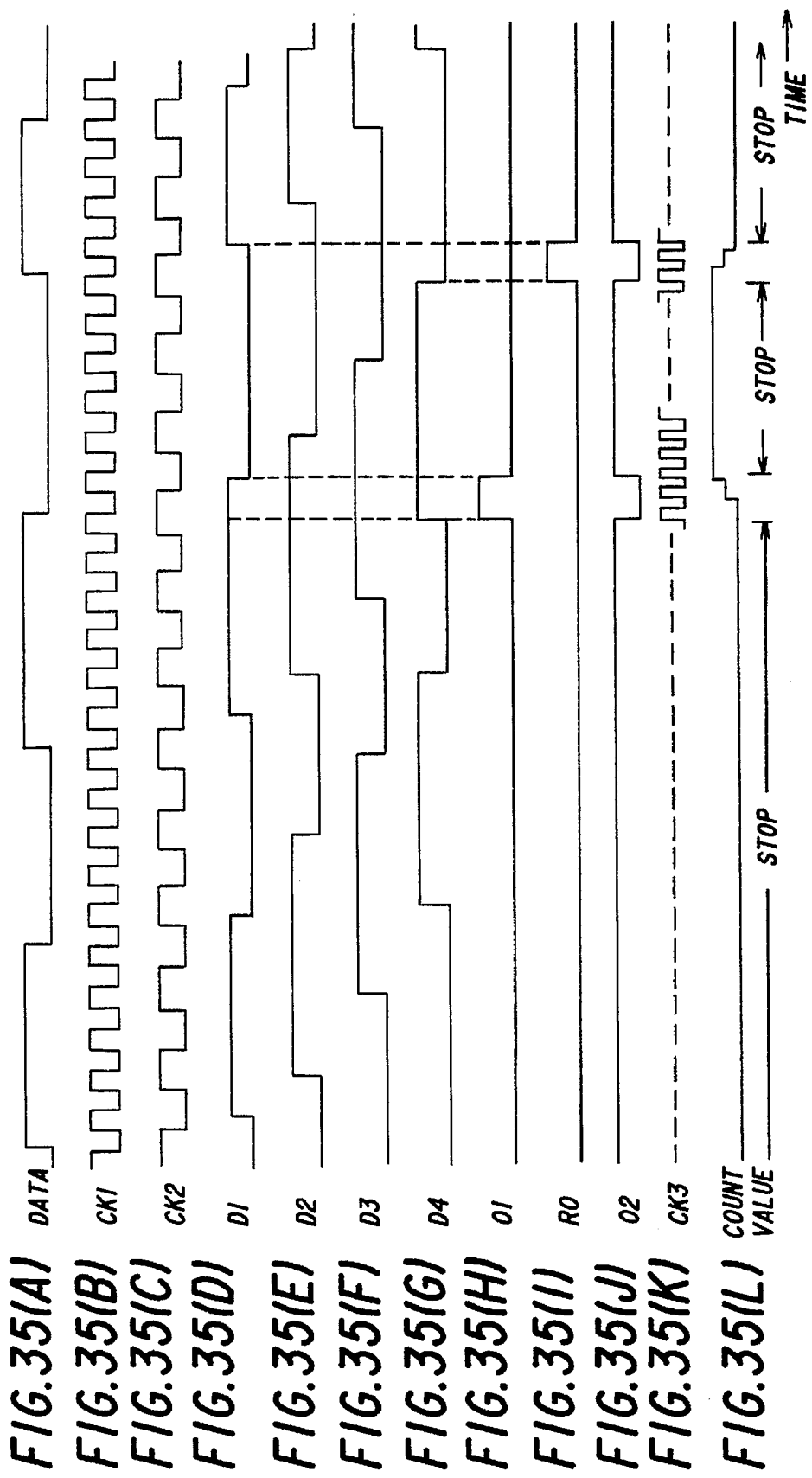
FIG. 35 is a timing chart of the operation of the structure show in FIG. 34.

Referring to FIG. 34, the signal DATA shown in (A) of FIG. 35 is applied to the terminal 140, and the clock signal CK1 shown in (B) of FIG. 35 is applied to the terminal 141. The signals applied to the terminals 140 and 141 are applied to the flip-flop 142. A clock signal CK2 ((C) of FIG. 35) obtained by dividing the frequency of the clock signal CK1 by two is applied to the flip-flops 143, 144 and 145 via a terminal 150. A clock signal CK3 having a frequency higher than that of the clock signal CK1 is applied to a terminal 151, and is applied to the NOR gate 149. As shown in (D) of FIG. 35, the flip-flop 142 outputs a delayed version D1 of the signal DATA which lags behind the signal DATA applied to the terminal 140 by one cycle of the clock signal CK1. As shown in (E) of FIG. 35, the flip-flop 143 outputs a delayed version D2 of the signal DATA which lags behind the signal DATA applied to the terminal 140 by two cycles of the clock signal CK1. As shown in (F) of FIG. 35, the flip-flop 144 outputs a delayed version D3 of the signal DATA which lags behind the signal DATA applied to the terminal 140 by four cycles of the clock signal CK1. As shown in (G) of FIG. 35, the flip-flop 145 outputs a delayed version D4 of the signal DATA which lags behind the signal DATA applied to the terminal 140 by six cycles of the clock signal CK1.

Hence, as shown in (H) of FIG. 35, the AND gate 146 generates the signal 01 which is switched to the high level when the signal DATA continues to be high for six cycles of the clock signal CK1 or more. As shown in (I) of FIG. 35, the NOR gate 147 generates the signal R0 which is switched to the high level when the signal DATA continues to be low for six cycles of the clock signal CK1 or more. As shown in (J) of FIG. 35, the NOR gate 148 produces the signal 02 from the signals 01 and R0, the signal 02 being applied to the NOR gate 149. The NOR gate 149 outputs, to the clock terminal CK of the up/down counter 16, the inverted version of the clock signal CK3 only when the signal 02 is low. Hence, the up/down counter 16 executes the up/down count operation on the extracted clock in accordance with the level of the signal 01. The counter value of the up/down counter 16 varies as shown in (L) of FIG. 35.

In the structure shown in FIG. 34, the clock signal CK2 has a frequency which is half the frequency of the clock signal CK1. Hence, by using four flip-flops 42–45, it is possible to detect the situation in which the input signal DATA continues to be low for six cycles of the clock signal CK1 or more. The structure shown in FIG. 34 has a number of flip-flops less than that of the flip-flops used in the structure shown in FIG. 32. Further, the count operation of the up/down counter 16 shown in FIG. 34 can operate at a speed higher than that of the up/down counter 16 shown in FIG. 32 because the frequency of the clock signal CK3 is higher than that of the clock signal CK1. However, it is possible to apply the clock signal CK1 to the terminal 151.

According to the sixth embodiment of the present invention, it is possible to prevent occurrence of noise due to an unnecessary variation in the gain of the electronic volume controllers and prevent the noise from being superimposed on the output signal. The sixth embodiment of the present invention can be applied to the first through fifth embodiments thereof.

Figure 36:
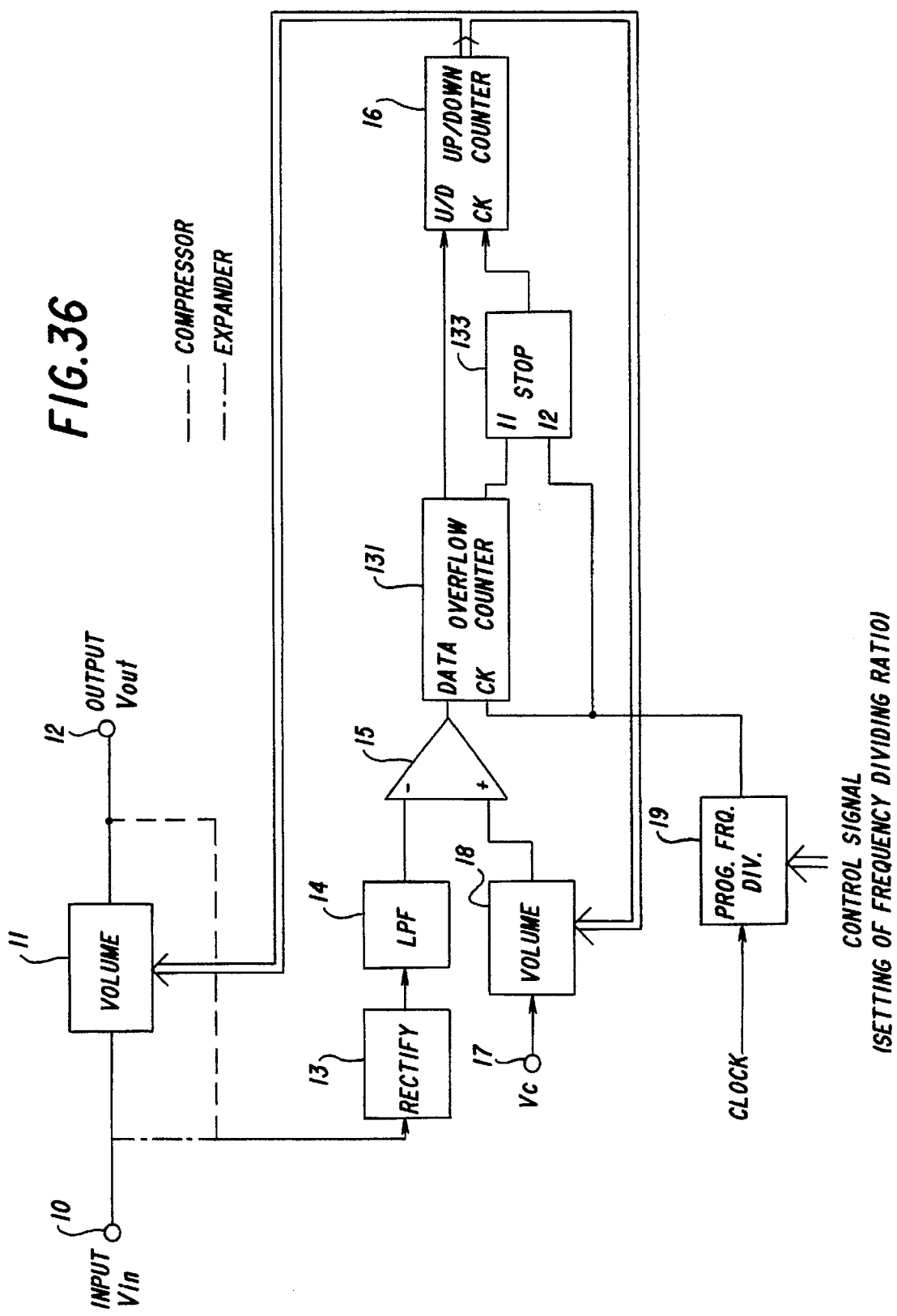
FIG. 36 is a block diagram of a compander circuit according to a seventh embodiment of the present invention.

FIG. 36 is a block diagram of a compander circuit (seventh embodiment of the present invention) obtained by applying the concept of the sixth embodiment of the present invention to the first embodiment thereof. The frequency-divided clock signal is applied to the overflow counter 131 and the clock supply control circuit 133.

The present invention is not limited to the specifically disclosed embodiments, and variations and modifications may be made without departing from the scope of the present invention.

What is claimed is:

1. A compander circuit comprising:

first and second volume controllers;

a comparator which compares a compared voltage with a rectified and smoothed signal of an input signal of the compander circuit or an output signal of the first volume controller receiving the input signal, the compared voltage being an output signal of the second volume controller;

a counter which executes a count operation on an output signal of the comparator in synchronism with a first clock signal and controls gains of the first and second volume controllers on the basis of a counter value of the counter; and means for variably controlling a frequency of the first clock signal applied to the counter by a predetermined control signal.

2. The compander circuit as claimed in claim 1, wherein said means comprises a frequency divider which divides a frequency of a second clock signal received by the compander circuit according to the predetermined control signal and which produces a frequency-divided output signal corresponding to said first clock signal.

3. The compander circuit as claimed in claim 1, wherein said predetermined control signal is a signal supplied from outside of the compander circuit.

4. The compander circuit as claimed in claim 2, wherein said predetermined control signal is a signal supplied from outside of the compander circuit.

5. The compander circuit as claimed in claim 1, wherein said predetermined control signal is a signal dependent on the output signal of the comparator.

6. The compander circuit as claimed in claim 2, wherein said predetermined control signal is a signal dependent on the output signal of the comparator.

7. The compander circuit as claimed in claim 1, wherein said predetermined control signal is a signal dependent on the counter value of the counter.

8. The compander circuit as claimed in claim 2, wherein said predetermined control signal is a signal dependent on the counter value of the counter.

9. The compander circuit as claimed in claim 1, wherein said means comprises means for setting the frequency of the first clock signal to different values when the input signal rises and falls.

10. The compander circuit as claimed in claim 1, wherein said means comprises means for gradually changing the frequency of the first clock signal when the input signal varies.

11. The compander circuit as claimed in claim 1, wherein said compander circuit is a compressor which compresses the input signal.

12. The compander circuit as claimed in claim 1, wherein said compander circuit is an expander which expands the input signal.

13. The compander circuit as claimed in claim 1, wherein said counter comprises an up/down counter that performs an up/down count operation based on the level of the output signal of the comparator.

14. The compander circuit as claimed in claim 1, further comprising means for supplying the first clock signal to the counter only when the input signal continues to be at a predetermined level for a predetermined duration.

15. A compander circuit comprising:

first and second volume controllers, the second volume controllers having a plurality of different input/output characteristics;

a comparator which compares a compared voltage with a rectified and smoothed signal of an input signal of the compander circuit or an output signal of the first volume controller receiving the input signal, the compared voltage being an output signal of the second volume controller;

a counter which executes a count operation on an output signal of the comparator in synchronism with a clock signal and controls gains of the first and second volume controllers on the basis of a counter value of the counter; and selecting means for selecting one of the plurality of different input/output characteristics according to a predetermined variable control signal, the compared voltage being based on said one of the plurality of different input/output characteristics.

16. The compander circuit as claimed in claim 15, wherein:

the second volume controller comprises a plurality of volume controller circuits having the different input/output characteristics; and said selecting means selects one of the plurality of volume controller circuits according to the predetermined control signal.

17. The compander circuit as claimed in claim 15, wherein:

said second volume controller comprises a single volume controller circuit and a switch which selects one of different constant voltages according to the predetermined control signal; and said selected one of the different constant voltages is applied to said single volume controller circuit.

18. The compander circuit as claimed in claim 17, wherein said single volume controller circuit operates on the basis of said counter value and said rectified and smoothed signal.

19. The compander circuit as claimed in claim 15, wherein said predetermined control signal is a signal dependent on said rectified and smoothed signal.

20. The compander circuit as claimed in claim 15, wherein said compander circuit comprises both a compressor characteristic and an expander characteristic.

21. The compander circuit as claimed in claim 15, further comprising means for supplying the clock signal to the counter only when the input signal continues to be at a predetermined level for a predetermined duration.

22. A compander circuit comprising:

first and second volume controllers;

a comparator which compares a compared voltage with a rectified and smoothed signal of an input signal of the compander circuit or an output signal of the first volume controller receiving the input signal, the compared voltage being an output signal of the second volume controller;

a first counter which executes a count operation on an output signal of the comparator in synchronism with a variable clock signal and controls gains of the first and second volume controllers on the basis of a counter value of the first counter; and means for supplying the clock signal to the first counter only when the input signal continues to be at a predetermined level for a predetermined term.

23. The compander circuit as claimed in claim 22, wherein said means comprises:

a second counter which produces an enable signal and a level instruction signal when the output signal of the comparator continues to be at a first level or a second level, the level instruction signal instructing the first counter to continue to output the counter value fixed to either the first level or the second level; and a clock supply control circuit which allows the clock signal to be applied to the first counter only when receiving the enable signal from the second counter, the first counter executing the count operation on the basis of the level instruction signal in synchronism with the clock signal supplied via the clock supply control circuit.

24. The compander circuit as claimed in claim 23, wherein said second counter comprises an overflow counter, shift registers which sequentially shift the output signal of the comparator, and a logic circuit which performs a logic operation on outputs of the shift registers.

25. The compander circuit as claimed in claim 24, wherein:

the shift registers comprise first and second groups of shift registers cascaded; and the first and second groups of shift registers operate at respective clock signals having different frequencies.

26. The compander circuit as claimed in claim 24, wherein the shift registers operate in synchronism with the clock signal applied to the first counter.

27. The compander circuit as claimed in claim 24, wherein the shift registers operate in synchronism with another clock signal different from the clock signal applied to the first counter.

28. A communications device comprising:

a transmit system; and a receive system, the transmit system and the receive system respectively having compander circuits, each of the transmit system and the receive system separately comprising:

first and second volume controllers;

a comparator which compares a compared voltage with a rectified and smoothed signal of an input signal of the compander circuit or an output signal of the first volume controller receiving the input signal, the compared voltage being an output signal of the second volume controller;

a counter which executes a count operation on an output signal of the comparator in synchronism with a clock signal and controls gains of the first and second volume controllers on the basis of a counter value of the counter; and means for controlling a frequency of the clock signal applied to the counter by a predetermined variable control signal.

29. The communications device as claimed in claim 28, wherein the compander circuit of the transmit system functions as a compressor and the compander circuit of the receive system functions as an expander.

30. A communications device comprising:

a transmit system; and a receive system, the transmit system having a compander circuit comprising:

first and second volume controllers, the second volume controllers having a plurality of different input/output characteristics;

a comparator which compares a compared voltage with a rectified and smoothed signal of an input signal of the compander circuit or an output signal of the first volume controller receiving the input signal, the compared voltage being an output signal of the second volume controller;

a counter which executes a count operation on an output signal of the comparator in synchronism with a variable clock signal and controls gains of the first and second volume controllers on the basis of a counter value of the counter; and selecting means for selecting one of the plurality of different input/output characteristics according to a predetermined control signal, the compared voltage being based on said one of the plurality of different input/output characteristics, the compander circuit having both a compressor characteristic and an expander characteristic.

* * * * *